United States Patent
Yamazaki

(10) Patent No.: US 11,555,119 B2
(45) Date of Patent: Jan. 17, 2023

(54) CURABLE GRANULAR SILICONE COMPOSITION, SEMICONDUCTOR MEMBER COMPRISING SAME, AND FORMING METHOD THEREOF

(71) Applicant: DOW TORAY CO., LTD., Tokyo (JP)

(72) Inventor: Ryosuke Yamazaki, Ichihara (JP)

(73) Assignee: DOW TORAY CO., LTD., Tokyo (JP)

( * ) Notice: Subject to any disclaimer, the term of this patent is extended or adjusted under 35 U.S.C. 154(b) by 525 days.

(21) Appl. No.: 16/624,368

(22) PCT Filed: May 22, 2018

(86) PCT No.: PCT/JP2018/019573
§ 371 (c)(1),
(2) Date: Dec. 19, 2019

(87) PCT Pub. No.: WO2018/235491
PCT Pub. Date: Dec. 27, 2018

(65) Prior Publication Data
US 2020/0392335 A1    Dec. 17, 2020

(30) Foreign Application Priority Data
Jun. 19, 2017   (JP) ............... JP2017-119951

(51) Int. Cl.
*C08L 83/04* (2006.01)
*B29C 45/00* (2006.01)
(Continued)

(52) U.S. Cl.
CPC ............ *C08L 83/04* (2013.01); *B29C 43/003* (2013.01); *B29C 45/0001* (2013.01);
(Continued)

(58) Field of Classification Search
None
See application file for complete search history.

(56) References Cited

U.S. PATENT DOCUMENTS

| 3,974,122 A | 8/1976 | Sato et al. |
| 8,013,057 B2* | 9/2011 | Taguchi ............ C08G 77/26 |
| | | 524/588 |

(Continued)

FOREIGN PATENT DOCUMENTS

| CN | 1879058 A | 12/2006 |
| CN | 104854176 A | 8/2015 |

(Continued)

OTHER PUBLICATIONS

Machine translation of JP-2002338230, translation generated Jun. 2022, 11 pages. (Year: 2022).*

(Continued)

*Primary Examiner* — Robert S Loewe
(74) *Attorney, Agent, or Firm* — Warner Norcross + Judd LLP

(57) ABSTRACT

A curable particulate silicone composition is disclosed. The composition comprises: (A) hot-melt silicone fine particles having a specific reactive functional group; (B) an inorganic filler; and (C) a curing agent. The content of component (B) is in the range of from 87 to 95 vol. % of the total composition. The curable particulate silicone composition provides a cured product having an average linear expansion coefficient of not greater than 15 ppm/° C. in a range of from 25° C. to 200° C. The curable particulate silicone composition provides a cured product having a very low average linear expansion coefficient over a wide temperature range when cured and is particularly suitable for overmold molding and the like.

12 Claims, 1 Drawing Sheet

(51) Int. Cl.
*H01L 23/29* (2006.01)
*B29C 43/00* (2006.01)
*C08K 3/013* (2018.01)
*C08K 9/06* (2006.01)
*B29K 83/00* (2006.01)
*B29K 105/00* (2006.01)

(52) U.S. Cl.
CPC ............... *C08K 3/013* (2018.01); *C08K 9/06* (2013.01); *H01L 23/296* (2013.01); *B29K 2083/00* (2013.01); *B29K 2105/251* (2013.01); *C08K 2201/003* (2013.01)

(56) References Cited

U.S. PATENT DOCUMENTS

| | | | |
|---|---|---|---|
| 8,933,158 | B2 | 1/2015 | Shiobara et al. |
| 9,115,285 | B2 * | 8/2015 | Chevalier ................. C09C 1/40 |
| 10,167,418 | B2 | 1/2019 | Yamazaki et al. |
| 2007/0293623 | A1 | 12/2007 | Kashiwagi et al. |
| 2008/0308828 | A1 | 12/2008 | Kashiwagi et al. |
| 2009/0121180 | A1 * | 5/2009 | Tsubokawa ........... H01L 23/296 |
| | | | 526/90 |
| 2009/0171013 | A1 | 7/2009 | Taguchi et al. |
| 2013/0274398 | A1 | 10/2013 | Shiobara et al. |
| 2014/0288235 | A1 | 9/2014 | Hirai et al. |
| 2014/0377570 | A1 | 12/2014 | Hirai et al. |
| 2015/0083324 | A1 | 3/2015 | Stanjeck et al. |
| 2015/0183960 | A1 | 7/2015 | Yamazaki et al. |
| 2015/0252221 | A1 | 9/2015 | Iimura et al. |
| 2016/0032148 | A1 | 2/2016 | Amako et al. |
| 2016/0207833 | A1 | 7/2016 | Ostendorf et al. |
| 2017/0190911 | A1 | 7/2017 | Iimura et al. |
| 2017/0355804 | A1 | 12/2017 | Fujisawa et al. |
| 2018/0105692 | A1 | 4/2018 | Imaizumi et al. |
| 2018/0208816 | A1 | 7/2018 | Yamazaki et al. |
| 2019/0169398 | A1 | 6/2019 | Yamazaki |
| 2019/0169435 | A1 | 6/2019 | Yamazaki |
| 2019/0177488 | A1 | 6/2019 | Yamazaki |

FOREIGN PATENT DOCUMENTS

| | | | | |
|---|---|---|---|---|
| CN | 110482912 | A | | 11/2019 |
| JP | 2002338230 | A | * | 11/2002 ............. C01B 33/12 |
| JP | 2007332259 | A | | 12/2007 |
| JP | 2008019424 | A | | 1/2008 |
| JP | 2009235368 | A | | 10/2009 |
| JP | 2013076050 | A | | 4/2013 |
| JP | 2013221075 | A | | 10/2013 |
| JP | 2014009322 | A | | 1/2014 |
| JP | 2014528488 | A | | 10/2014 |
| JP | 2016124967 | A | | 7/2016 |
| WO | 2005045525 | A1 | | 5/2005 |
| WO | 2013051600 | A1 | | 11/2013 |
| WO | 2014099639 | A1 | | 6/2014 |
| WO | 2014150841 | A2 | | 9/2014 |
| WO | 2015194158 | A1 | | 12/2015 |
| WO | 2016136243 | A1 | | 1/2016 |
| WO | 2016038836 | A1 | | 3/2016 |
| WO | 2016103654 | A1 | | 6/2016 |
| WO | 2016136243 | A1 | | 9/2016 |
| WO | 2018030288 | A1 | | 2/2018 |

OTHER PUBLICATIONS

English translation of International Search Report for Appl. No. PCT/JP2017/028384, dated Oct. 31, 2017, 2 pages.
Machine assisted English translation of WO2013051600A1 obtained from https://patents.google.com on Apr. 30, 2019, 37 pages.
Machine assisted English translation of WO2016038836A1 obtained from https://patents.google.com on Apr. 30, 2019, 23 pages.
English translation of International Search Report for Int. Appl. No PCT/JP2017/028385, dated Oct. 31, 2017, 2 pages.
Machine assisted English translation of JP2007332259A obtained from https://patents.google.com on Apr. 30, 2019, 17 pages.
Machine assisted English translation of JP2008019424A obtained from https://patents.google.com on Apr. 30, 2019, 11 pages.
English translation of International Search Report for Int. Appl. No PCT/JP2017/028386, dated Oct. 31, 2017, 2 pages.
English translation of International Search Report for PCT/JP2018/019573 dated Aug. 28, 2018, 2 pages.
Machine assisted English translation of JP2016124967A obtained from https://patents.google.com/patent on Mar. 19, 2020, 22 pages.

* cited by examiner

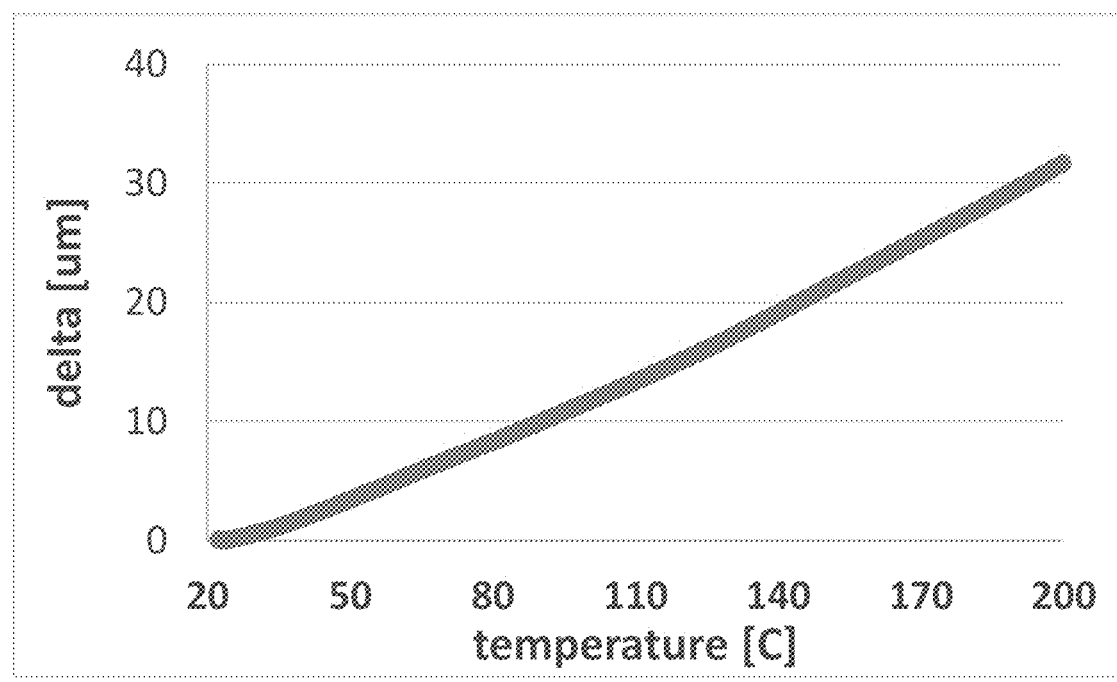

CURABLE GRANULAR SILICONE COMPOSITION, SEMICONDUCTOR MEMBER COMPRISING SAME, AND FORMING METHOD THEREOF

CROSS-REFERENCE TO RELATED APPLICATIONS

This application is the National Stage of International Appl. No. PCT/JP2018/019573 filed on 22 May 2018, which claims priority to and all advantages of Japanese Appl. No. 2017-119951 filed on 19 Jun. 2017, the content of which is hereby incorporated by reference.

TECHNICAL FIELD

The present invention relates to a curable particulate silicone composition which provides a cured product having a very low average linear expansion coefficient over a wide temperature range when cured and which is particularly suitable for overmold molding, a pellet molded from the curable particulate silicone composition, and the like. Further, the present invention relates to a cured product using the curable particulate silicone composition, pellet, or the like, a molding method for the cured product, and a semiconductor device provided with the cured product.

BACKGROUND ART

Curable silicone compositions are utilized in a wide range of industrial fields because they are cured to form cured products having excellent heat resistance, cold resistance, electrical insulation, weather resistance, water repellency, and transparency. The cured product of such a curable silicone composition is also suitable as a sealant for optical materials and semiconductor devices because it is hardly discolored as compared with other organic materials, and physical properties are less deteriorated.

The present applicant has proposed, in Patent Document 1 and Patent Document 2, a so-called hot melt curable particulate silicone composition and a reactive silicone composition. These hot-melt silicone compositions are easy to handle for handling workability, particularly used for overmold molding, etc. On the other hand, cured products obtained by curing these silicone compositions provide a large average linear expansion coefficient especially at a temperature of from room temperature to a high temperature of about 150° C., and the hardness and toughness thereof are insufficient in some cases. Furthermore, since the cured products obtained by curing these silicone compositions change the storage modulus significantly at a high temperature of particularly about 250° C., further improvements in physical properties have been desired for application to semiconductor applications, especially power semiconductor applications, which are expected to operate at high temperatures.

On the other hand, the present applicant has proposed a liquid (pasty) curable silicone composition having an average linear expansion coefficient (average linear expansion coefficient) of 200 ppm/° C. or less at 25° C. to 200° C. However, these liquid or pasty curable silicone compositions are excellent in physical properties such as average linear expansion coefficient, but since they are liquid, it is difficult to use for molding by overmolding, and warp or breakage problems may occur due to insufficient mechanical strength of the cured product. Furthermore, in recent overmolding applications, when a lower average linear expansion coefficient is required, only a composition with an average linear expansion coefficient of 20 ppm/° C. or higher has been disclosed or realized as a silicone composition that has not been subjected to organic modification (epoxy group modification, isocyanuric group modification, or the like) with conventional technology, and a hot meltable curable silicone composition that provides a cured product with an average linear expansion coefficient of 15 ppm/° C. or lower has been unknown.

PRIOR ART DOCUMENTS

Patent Documents

Patent Document 1: International Patent Application PCT/JP2016/000959
Patent Document 2: Japanese Unexamined Patent Application Publication No. 2014-009322
Patent Document 3: Japanese Translation of PCT Application (WO) No. 2014-528488

SUMMARY OF THE INVENTION

Problems to be Solved by the Invention

An object of the present invention is to provide a curable particulate silicone composition having hot-melt properties, having excellent handling workability such as overmold molding and curing characteristics, and providing a cured product having an average linear expansion coefficient of not greater than 15 ppm/° C. and having excellent hardness and toughness at a temperature of from room temperature to a high temperature of about 250° C., and a pellet or the like formed by molding the curable particulate silicone composition. Another object of the present invention is to provide a semiconductor device member composed of such a curable particulate silicone composition and a cured product such as pellets, a semiconductor device having the cured product, and a molding method of the cured product.

Means for Solving the Problems

The curable particulate silicone composition of the present invention contains:
(A) hot-melt silicone fine particles having a softening point of 30° C. or higher and having a hydrosilylation reactive group and/or a radical reactive group;
(B) an inorganic filler (fine particles); and
(C) a curing agent; wherein:
a content of component (B) is in a range of from 87 to 95 vol. % of the total composition; and the curable particulate silicone composition provides a cured product having an average linear expansion coefficient of not greater than 15 ppm/° C. in a range of from 25° C. to 200° C.

Component (B) is preferably treated with a silicone-based surface treatment agent at 0.1 to 2.0 mass % relative to the mass of the entire component (B), and is particularly preferably treated with a silicone-based surface treatment agent having at least one polysiloxane structure and a hydrolyzable silyl group in the molecule. In addition, component (B) is preferably a filler which does not have a softening point or which does not soften below the softening point of component (A), and is preferably substantially an inorganic filler having an average particle diameter of 10.0 μm or more. Further, from the viewpoint of the functionality and physical properties of the cured product, component (B) is preferably a reinforcing filler, a white pigment, a thermally conductive filler, a conductive filler, a phosphor, or a mixture of at least two of these. In particular, since the hardness at from room temperature to a high temperature and the rate of change in storage modulus are small, it is particularly preferable for component (B) to be a spherical inorganic filler or thermally conductive filler having an average particle diameter of 10.0 μm or more.

The curable particulate silicone composition of the present invention is hot meltable and has a melt viscosity of not greater than 200 Pa·s and more preferably not greater than 100 Pa·s at 180° C. Note that the melt viscosity is a value measured by a Koka-type flow tester.

Component (A) is preferably silicone fine particles including ($A_1$) a resinous organopolysiloxane, ($A_2$) an organopolysiloxane crosslinked product obtained by partially crosslinking at least one organopolysiloxane, ($A_3$) a block copolymer composed of a resinous organosiloxane block and a chained organosiloxane block, or a mixture of at least two of these. In addition, it is particularly preferable that component (A) is true-spherical silicone fine particles in which 10 mol % or more of the silicon atom-bonded organic groups in component (A) is an aryl group and the average primary particle diameter thereof is 1 to 10 μm, and such true-spherical silicone fine particles are preferably obtained by use of a spray dryer or the like.

The content of component (B) is preferably in the range of 100 to 4000 parts by mass, particularly preferably in the range of 500 to 4000 parts by mass, with regard to 100 parts by mass of component (A). In the composition of the present invention, it is possible to compound component (B) in a large amount, and it is possible and suitable to compound component (B) in a quantitative range of not less than 87 vol. % of the entire composition.

The cured product obtained by curing the composition of the present invention is particularly preferably a cured product having a bending strength of 15 MPa or greater as measured by the method prescribed in JIS K 6911-1995 "General Testing Method for Thermosetting Plastics".

The curable particulate silicone composition of the present invention is preferably in the form of pellets or sheets.

The curable particulate silicone composition of the present invention can be used in the form of a cured product and can be used as a member for a semiconductor device.

The curable particulate silicone composition of the present invention and the cured product thereof can be used in a semiconductor device, and a power semiconductor device in which a sealant is formed by the cured product is provided. In particular, the curable particulate silicone composition of the present invention can be suitably used for overmold molding, and since the cured product thereof is excellent in hardness at room temperature to high temperature and tough, a semiconductor device having a structure in which a semiconductor element or a semiconductor circuit board is overmolded by the cured product, particularly, a power semiconductor device is suitably provided.

The method of molding the curable particulate silicone composition of the present invention includes at least the following steps.

(I) a step of heating and melting the curable particulate silicone composition described above to the softening point of component (A) or higher;

(II) a step of injecting the curable silicone composition obtained in step (I) into a mold or a step of distributing the curable silicone composition obtained in step (I) to a mold by clamping; and (III) a step of curing the curable silicone composition injected in step (II).

Note that the molding method described above includes transfer molding, compression molding, or injection molding, and the curable particulate silicone composition of the present invention is suitably used as a material for the molding thereof. Furthermore, the curable particulate silicone composition of the present invention can be suitably used as a molding material in a so-called overmold method, which is a step of coating a semiconductor element or a semiconductor circuit board with the cured product by overmold molding.

Effects of the Invention

The curable particulate silicone composition (including a pellet form) of the present invention has hot-melt properties, has excellent handling workability such as overmold molding and curing characteristics, and provides a cured product having an average linear expansion coefficient of not greater than 15 ppm/° C. and having excellent hardness and toughness at a temperature of from room temperature to a high temperature of about 250° C. In addition, the cured product of the present invention is useful as a member of a semiconductor device, and by using the molding method of the present invention, particularly overmold molding, these cured products can be efficiently produced in accordance with applications.

BRIEF DESCRIPTION OF THE DRAWINGS

FIG. 1 illustrates the linear expansion coefficient curve of the cured product of Example 1 at 25° C. to 200° C. (the horizontal axis represents temperature (units: ° C.), and the vertical axis represents change in size (delta, units: μm).

MODE FOR CARRYING OUT THE INVENTION

[Curable Particulate Silicone Composition]

The curable particulate silicone composition of the present invention contains the following components (A) to (C); wherein the content of component (B) is in a range of from 87 to 95 vol. % of the total composition; and the curable particulate silicone composition provides a cured product having an average linear expansion coefficient of not greater than 15 ppm/° C. in a range of from 25° C. to 200° C.

(A) hot-melt silicone fine particles having a softening point of 30° C. or higher and having a hydrosilylation reactive group and/or a radical reactive group;

(B) an inorganic filler (fine particles); and (C) a curing agent.

Hereinafter, each component and optional component of the composition will be described. In the present invention, the term "average particle diameter" means the primary average particle diameter of the particles unless otherwise defined.

Component (A) is hot-melt silicone fine particles having a softening point of 30° C. or higher and having a hydrosilylation reactive group and/or a radical reactive group, and provides good hot-melt properties to the composition and is cured by the curing agent (C).

Examples of the hydrosilylation reactive group in component (A) include an alkenyl group having 2 to 20 carbon atoms such as vinyl groups, allyl groups, butenyl groups, pentenyl groups, hexenyl groups, heptenyl groups, octenyl groups, nonenyl groups, decenyl groups, undecenyl groups, and dodecenyl groups, and a silicon atom bonded hydrogen atom. As the hydrosilylation reactive group, an alkenyl group is preferable. The alkenyl group may be linear or branched, and is preferably a vinyl group or a hexenyl group. Component (A) preferably has at least two hydrosilylation reactive groups in one molecule.

Examples of the group bonded to a silicon atom other than the hydrosilylation reactive group in component (A) include an alkyl group having 1 to 20 carbon atoms, a halogen-substituted alkyl group having 1 to 20 carbon atoms, an aryl group having 6 to 20 carbon atoms, a halogen-substituted aryl group having 6 to 20 carbon atoms, an aralkyl group having 7 to 20 carbon atoms, an alkoxy group, and a hydroxyl group. Specific examples thereof include alkyl groups such as methyl, ethyl, propyl, butyl, pentyl, hexyl, heptyl, octyl, nonyl, decyl, undecyl, and dodecyl; aryl groups such as phenyl, tolyl, xylyl, naphthyl, anthracenyl, phenanthryl, and pyrenyl; aralkyl groups such as phenethyl and phenylpropyl; groups in which a part or all of the hydrogen atoms bonded to these groups are substituted with a halogen atom such as a chlorine atom and a bromine atom; and alkoxy groups such as methoxy, ethoxy, and propoxy. In particular, a phenyl group and a hydroxyl group are preferable.

Examples of radical reactive groups in component (A) include alkyl groups having 1 to 20 carbon atoms, such as methyl, ethyl, propyl, butyl, pentyl, hexyl, heptyl, octyl, nonyl, decyl, undecyl, and dodecyl; alkenyl groups having 2 to 20 carbon atoms, such as vinyl, allyl, butenyl, pentenyl, hexenyl, heptenyl, octenyl, nonenyl, decenyl, undecenyl, and dodecenyl; acryl-containing groups such as 3-acryloxypropyl and 4-acryloxybutyl; methacryl-containing groups such as 3-methacryloxypropyl and 4-methacryloxybutyl; and a silicon atom bonded hydrogen atom. As the radical reactive group, an alkenyl group is preferable. The alkenyl group may be linear or branched, and is preferably a vinyl group or a hexenyl group. Component (A) preferably has at least two radical reactive groups in one molecule.

Examples of the group bonded to a silicon atom other than the radical reactive group in component (A) include a halogen-substituted alkyl group having 1 to 20 carbon atoms, an aryl group having 6 to 20 carbon atoms, a halogen-substituted aryl group having 6 to 20 carbon atoms, an aralkyl group having 7 to 20 carbon atoms, an alkoxy group, and a hydroxyl group, and the same groups as those described above are exemplified. In particular, a phenyl group and a hydroxyl group are preferable. In particular, in component (A), it is preferable that 10 mol % or more of the total organic groups in the molecule be an aryl group, in particular, a phenyl group.

Component (A) itself has hot-melt properties and is cured by the curing agent (C) described later. Such a component (A) is preferably silicone fine particles consisting of:

($A_1$) a resinous organopolysiloxane;

($A_2$) an organopolysiloxane crosslinked product obtained by crosslinking at least one type of organopolysiloxane;

($A_3$) a block copolymer composed of a resinous organosiloxane block and a chained organosiloxane block; or a mixture of at least two types thereof.

Component ($A_1$) is a resinous organopolysiloxane having a hydrosilylation reactive group and/or a radical reactive group, and is preferably a hot-melt resinous organopolysiloxane having a large number of T-units or Q-units and an aryl group. Examples of such a component ($A_1$) include MQ resins, MDQ resins, MTQ resins, MDTQ resins, TD resins, TQ resins, and TDQ resins consisting of any combination of: a triorganosiloxane unit (M unit) (the organo group is a methyl group only, a methyl group and a vinyl group, or a phenyl group); a diorganosiloxane unit (D unit) (the organo group is a methyl group only, a methyl group and a vinyl group, or a phenyl group); a monoorganosiloxane unit (T unit) (the organo group is a methyl group, a vinyl group, or a phenyl group); and a siloxy unit (Q unit). It is preferable that component ($A_1$) has at least two hydrosilylation reactive groups and/or radical reactive groups in the molecule, and 10 mol % or more of the total organic groups in the molecule is an aryl group, particularly, a phenyl group.

In addition, since component ($A_2$) is formed by crosslinking at least one organopolysiloxane, cracks are hardly generated when the component is cured by the curing agent (C), and the curing shrinkage can be reduced. Here, "crosslinking" means linking the organopolysiloxane as a raw material by a hydrosilylation reaction, a condensation reaction, a radical reaction, a high energy ray reaction, or the like. Examples of the hydrosilylation reactive group and the radical reactive group (including the high energy ray reactive group) include the same groups as those described above, and examples of the condensation reactive group include a hydroxyl group, an alkoxy group, and an acyloxy group.

The unit constituting component ($A_2$) is not limited, and siloxane units and siloxane units containing silalkylene groups are exemplified, and it is preferable to have a resinous polysiloxane unit and a chained polysiloxane unit in the same molecule because they impart adequate hardness and mechanical strength to the obtained cured product. That is, component ($A_2$) is preferably a crosslinked product of a resinous organopolysiloxane and a chained organopolysiloxane (including a linear or branched chain organopolysiloxane). By introducing the resinous organopolysiloxane structure-chained organopolysiloxane structure into component ($A_2$), component ($A_2$) exhibits good hot-melt properties, and the curing agent (C) exhibits good curing properties.

Component (A2) is any one of the following (1) to (3):

(1) One obtained by linking a resinous organopolysiloxane structure-chain organopolysiloxane structure in the molecule by an alkylene linkage via a hydrosilylation reaction of an organopolysiloxane having at least two alkenyl groups in one molecule and an organopolysiloxane having at least two silicon atom bonded hydrogen atoms in one molecule;

(2) One obtained by linking a resinous organopolysiloxane structure-chain organopolysiloxane structure in the molecule by a siloxane linkage or an alkylene linkage via a radical reaction of an organic peroxide of at least two organopolysiloxanes having at least two radical reactive groups in one molecule;

(3) One obtained by linking a resinous organopolysiloxane structure-chain organopolysiloxane structure in the molecule by a siloxane (—Si—O—Si—) linkage via a condensation reaction of at least two organopolysiloxanes. Such component ($A_2$) has a structure in which organopolysiloxane moieties of the resin structure-chain structure are linked by an alkylene group or new siloxane linkage, so that hot-melt properties are remarkably improved.

In the above (1) and (2), as the alkylene group contained in component ($A_2$), an alkenyl group having 2 to 20 carbon atoms such as an ethylene group, a propylene group, a butylene group, a pentylene group, a hexylene group, or the like is exemplified, and these groups may be linear or branched, and are preferably an ethylene group or a hexylene group.

The crosslinked products of resinous organopolysiloxanes and chain organopolysiloxanes, including linear or branched chain organopolysiloxanes, are composed of, for example, the following siloxane units and siloxane units containing silalkylene groups:

M-units: siloxane units represented by $R^1R^2{}_2SiO_{1/2}$;
D-units: siloxane units represented by $R^1R^2SiO_{2/2}$;
$R^3M/R^3D$-units: at least one siloxane unit selected from a silalkylene group containing siloxane unit represented by $R^3{}_{1/2}R^2{}_2SiO_{1/2}$ and a silalkylene group containing siloxane unit represented by $R^3{}_{1/2}R^2O_{2/2}$; and
T/Q-units: at least one siloxane unit selected from a siloxane unit represented by $R^2SiO_{3/2}$ and a siloxane unit represented by $SiO_{4/2}$.

In the formula, each $R_1$ is independently an alkyl group having 1 to 20 carbon atoms, a halogen-substituted alkyl group having 1 to 20 carbon atoms, an alkenyl group having 2 to 20 carbon atoms, an aryl group having 6 to 20 carbon atoms, a halogen-substituted aryl group having 6 to 20 carbon atoms, or an aralkyl group having 7 to 20 carbon atoms, and the same groups as described above are exemplified. $R^1$ is preferably a methyl group, a vinyl group, or a phenyl group. However, it is preferable that at least two $R^1$ of all siloxane units are alkenyl groups.

In addition, in the formula, each $R^2$ is independently an alkyl group having 1 to 20 carbon atoms, a halogen-substituted alkyl group having 1 to 20 carbon atoms, an aryl group having 6 to 20 carbon atoms, a halogen-substituted aryl group having 6 to 20 carbon atoms, or an aralkyl group having 7 to 20 carbon atoms, and the same groups as the $R^1$ are exemplified. $R^2$ is preferably a methyl group or a phenyl group.

In the formulae, $R^3$ is a linear or branched alkylene group having 2 to 20 carbon atoms bonded to a silicon atom in other siloxane units. As the alkylene group, the same groups as described above are exemplified, and an ethylene group and a hexylene group are preferable.

The M-unit is a siloxane unit constituting the terminal of component $(A_2)$, and the D-unit is a siloxane unit constituting a linear polysiloxane structure. Note that it is preferable that an alkenyl group is present on the M-unit or the D-unit, in particular, the M-unit. On the other hand, the $R^3M$-unit and the $R^3D$-unit are siloxane units bonded to a silicon atom in another siloxane unit via a silalkylene linkage and bonded to a silicon atom in another siloxane unit via an oxygen atom. The T/Q-unit is a branched siloxane unit which gives a resinous structure to the polysiloxane, and component $(A_2)$ preferably contains a siloxane unit represented by $R^2SiO_{3/2}$ and/or a siloxane unit represented by $SiO_{4/2}$. In particular, since the hot-melt properties of component $(A_2)$ are improved and the content of the aryl group in component $(A_2)$ is adjusted, it is preferable that component $(A_2)$ contains a siloxane unit represented by $R^2SiO_{3/2}$, and in particular, it is preferable that component $(A_2)$ contains a siloxane unit in which $R^2$ is a phenyl group.

The $R^3M/R^3D$-unit is one of the characteristic structures of component $(A_2)$, and represents a structure in which silicon atoms are crosslinked via the alkylene group of $R^3$. Specifically, the $R^3M/R^3D$-unit is at least one siloxane unit selected from an alkylene group-containing siloxane unit represented by $R^3{}_{1/2}R^2{}_2SiO_{1/2}$ and an alkylene group-containing siloxane unit represented by $R^3{}_{1/2}R^2SiO_{2/2}$, and at least two of all siloxane units constituting component $(A_2)$ are preferably these alkylene group-containing siloxane units. The preferred form of linkage between siloxane units having alkylene groups of $R^3$ is as described above, and the number of $R^3$ between two alkylene group-containing siloxane units is expressed as the linkage number "½" as is the number of oxygens and the like in the M-units. Assuming that the number of $R^3$ is 1, at least one selected from the structural units of siloxanes represented by $[O_{1/2}R^2{}_2SiR^3SiR^2{}_2O_{1/21}]$, $[O_{1/2}R^2{}_2SiR^3SiR^2O_{2/2}]$, and $[O_{2/2}R^2SiR^3SiR^2O_{2/2}]$ is contained in component $(A_2)$, and each oxygen atom (O) is bonded to a silicon atom contained in the M, D, and T/Q-units. With such a structure, component $(A_2)$ can relatively easily design a structure having a chain polysiloxane structure comprised of D-units and a resinous polysiloxane structure containing T/Q-units in the molecule, and the component is remarkably excellent in physical properties.

In the above (1), the component can be obtained by hydrosilylation reaction of an organopolysiloxane having at least two alkenyl groups in one molecule and an organopolysiloxane having at least two silicon atom bonded hydrogen atoms in one molecule at a reaction ratio of [number of moles of alkenyl groups]/[number of moles of silicon atom bonded hydrogen atoms]>1.

In the above (2), the component can be obtained by radical reaction of at least two organopolysiloxanes having at least two radical reactive groups in one molecule with an organic peroxide in an amount which is insufficient for all radical reactive groups in the system to react.

In the above (1) and (2), component $(A_2)$ is obtained by subjecting an organopolysiloxane having a resinous siloxane structure and an organopolysiloxane having a chain siloxane structure to a hydrosilylation reaction or a radical reaction.

For example, component $(A_2)$ is an organopolysiloxane obtained by reacting:

$(A^R)$ at least one type of resinous organopolysiloxane containing a siloxane unit represented by $R^2SiO_{3/2}$ (where $R^2$ is the same group as described above) and/or a siloxane unit represented by $SiO_{4/2}$ in the molecule and having an alkenyl group with 2 to 20 carbon atoms or a silicon-bonded hydrogen atom or a radical reactive group; and $(A^L)$ at least one type of chained organopolysiloxane (AL) containing a siloxane unit represented by $R^2{}_2SiO_{2/2}$ (where $R^2$ is the same group as described above) in the molecule and having a group capable of a hydrosilylation reaction or a radical reaction with the component $(A^R)$, the group being an alkenyl group with 2 to 20 carbon atoms or a silicon-bonded hydrogen atom;

at a ratio designed so that the hydrosilylation reactive group and/or radical reactive group in component $(A^R)$ or component $(A^L)$ remains after the reaction.

In the above (1), when at least a part of component $(A^R)$ is a resinous organopolysiloxane having an alkenyl group of 2 to 20 carbon atoms, it is preferable that at least a part of component $(A^L)$ is a chain organopolysiloxane having a silicon atom bonded hydrogen atom.

Similarly, when at least a part of component $(A^R)$ is a resinous organopolysiloxane having a silicon atom bonded hydrogen atom, it is preferable that at least a part of component $(A^L)$ is a chain organopolysiloxane having an alkenyl group of 2 to 20 carbon atoms.

Such a component $(A_2)$ is preferably:

component $(a_1)$: a substance obtained by performing a radical reaction on an organopolysiloxane having at least two alkenyl groups with 2 to 20 carbon atoms in the molecule containing the component $(a_{1-1})$ below and/or the component $(a_{1-2})$ below, with an organic peroxide; or a substance obtained by performing a hydrosilylation reaction on component $(a_1)$ and $(a_2)$ an organohydrogenpolysiloxane in the presence of a hydrosilylation reaction catalyst in an amount such that the molar ratio of the silicon-bonded hydrogen atoms in the component $(a_2)$ is from 0.2 to 0.7 mol with respect to the alkenyl groups having 2 to 20 carbon atoms included in the component ($a_1$).

Component ($a_{1-1}$) is polysiloxanes with relatively large amounts of branching units, and organopolysiloxanes having at least two alkenyl groups in one molecule, expressed by the average unit formula:

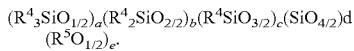
$(R^4{}_3SiO_{1/2})_a(R^4{}_2SiO_{2/2})_b(R^4SiO_{3/2})_c(SiO_{4/2})_d$
$(R^5O_{1/2})_e$.

In the formula, each $R^4$ is independently an alkyl group having 1 to 20 carbon atoms, a halogen-substituted alkyl group having 1 to 20 carbon atoms, an alkenyl group having 2 to 20 carbon atoms, an aryl group having 6 to 20 carbon atoms, a halogen-substituted aryl group having 6 to 20 carbon atoms, or an aralkyl group having 7 to 20 carbon atoms, and the same groups as the $R^1$ are exemplified. Preferably, $R^4$ is a methyl group, a vinyl group, or a phenyl group. Note that at least two of $R^4$ are alkenyl groups. In addition, since the hot-melt properties are good, it is preferable that 10 mol % or more, or 20 mol % or more of the total R4 is a phenyl group. Furthermore, in the formula, $R^5$ is a hydrogen atom or an alkyl group having 1 to 6 carbon atoms, and the same alkyl groups as those described above are exemplified.

In the formula, a is a number within the range of 0 to 0.7, b is a number within the range of 0 to 0.7, c is a number within the range of 0 to 0.9, d is a number within the range of 0 to 0.7, e is a number within the range of 0 to 0.1, and c+d is a number within the range of 0.3 to 0.9, a+b+c+d is 1, preferably a is a number within the range of 0 to 0.6, b is a number within the range of 0 to 0.6, c is a number within the range of 0 to 0.9, d is a number within the range of 0 to 0.5, e is a number within the range of 0 to 0.05, and c+d is a number within the range of 0.4 to 0.9, a+b+c+d is 1. This is because the hardness and mechanical strength of the obtained cured product are excellent when a, b, and c+d are each a number within the above range.

As component ($a_{1-1}$), the following organopolysiloxanes are exemplified. In the formula, Me, Ph, and Vi represent a methyl group, a phenyl group, and a vinyl group, respectively.

$(ViMe_2SiO_{1/2})_{0.25}(PhSiO_{3/2})_{0.75}(HO_{1/2})_{0.02}$ $(ViMe_2SiO_{1/2})_{0.25}(PhSiO_{3/2})_{0.75}$ $(ViMe_2SiO_{1/2})_{0.20}(PhSiO_{3/2})_{0.80}$ $(ViMe_2SiO_{1/2})_{0.15}(Me_3SiO_{1/2})_{0.38}(SiO_{4/2})_{0.47}$
$(HO_{1/2})_{0.01}$ $(ViMe_2SiO_{1/2})_{0.13}(Me_3SiO_{1/2})_{0.45}(SiO_{4/2})_{0.42}$
$(HO_{1/2})_{0.01}$ $(ViMe_2SiO_{1/2})_{0.15}(PhSiO_{3/2})_{0.85}(HO_{1/2})_{0.01}$ $(Me_2SiO_{2/2})_{0.15}(MeViSiO_{2/2})_{0.10}(PhSiO_{3/2})_{0.75}$
$(HO_{1/2})_{0.04}$ $(MeViPhSiO_{1/2})_{0.20}(PhSiO_{3/2})_{0.80}(HO_{1/2})_{0.05}$ $(ViMe_2SiO_{1/2})_{0.15}(PhSiO_{3/2})_{0.75}(SiO_{4/2})_{0.10}$
$(HO_{1/2})_{0.02}$ $(Ph_2SiO_{2/2})_{0.25}(MeViSiO_{2/2})_{0.30}(PhSiO_{3/2})_{0.45}$
$(HO_{1/2})_{0.04}$ $(Me_3SiO_{1/2})_{0.20}(ViMePhSiO_{1/2})_{0.40}(SiO_{4/2})_{0.40}$
$(HO_{1/2})_{0.08}$

Component ($a_{1-2}$) is polysiloxanes with relatively large amounts of chain siloxane units, and organopolysiloxanes having at least two alkenyl groups in one molecule, expressed by the average unit formula:

$(R^4{}_3SiO_{1/2})_{a'}(R^4{}_2SiO_{2/2})_{b'}(R^4SiO_{3/2})_{c'}(SiO_{4/2})_{d'}$
$(R^5O_{1/2})_{e'}$.

In the formula, $R^4$ and $R^5$ are the same groups as described above.

In the formula, a' is a number within the range of 0.01 to 0.3, b' is a number within the range of 0.4 to 0.99, c' is a number within the range of 0 to 0.2, d' is a number within the range of 0 to 0.2, e' is a number within the range of 0 to 0.1, and c'+d' is a number within the range of 0 to 0.2, a'+b'+c'+d' is 1, preferably a' is a number within the range of 0.02 to 0.20, b' is a number within the range of 0.6 to 0.99, c' is a number within the range of 0 to 0.1, d' is a number within the range of 0 to 0.1, j' is a number within the range of 0 to 0.05, and c'+d' is a number within the range of 0 to 0.1, a'+b'+c'+d' is 1. This is because if a', b', c', and d' are each a number within the above range, the obtained cured product can be imparted with toughness.

As such a component ($a_{1-2}$), the following organopolysiloxanes are exemplified. In the formula, Me, Ph, and Vi represent a methyl group, a phenyl group, and a vinyl group, respectively.

$ViMe_2SiO(MePhSiO)_{18}SiMe_2Vi$, i.e., $(ViMe_2SiO_{1/2})_{0.10}(MePhSiO_{2/2})_{0.90}$ $ViMe_2SiO(MePhSiO)_{30}SiMe_2Vi$, i.e., $(ViMe_2SiO_{1/2})_{0.63}(MePhSiO_{2/2})_{0.937}$ $ViMe_2SiO(MePhSiO)_{150}SiMe_2Vi$, i.e., $(ViMe_2SiO_{1/2})_{0.013}(MePhSiO_{2/2})_{0.987}$ $ViMe_2SiO(Me_2SiO)_{18}SiMe_2Vi$, i.e., $(ViMe_2SiO_{1/2})_{0.10}(Me_2SiO_{2/2})_{0.90}$ $ViMe_2SiO(Me_2SiO)_{30}SiMe_2Vi$, i.e., $(ViMe_2SiO_{1/2})_{0.063}(Me_2SiO_{2/2})_{0.937}$ $ViMe_2SiO(Me_2SiO)_{35}(MePhSiO)_{13}SiMe_2Vi$, i.e., $(ViMe_2SiO_{1/2})_{0.04}(Me_2SiO_{2/2})_{0.70}$
$(MePhSiO_{2/2})_{0.26}$ $ViMe_2SiO(Me_2SiO)_{10}SiMe_2Vi$, i.e., $(ViMe_2SiO_{1/2})_{0.17}(Me_2SiO_{2/2})_{0.83}$ $(ViMe_2SiO_{1/2})_{0.10}(MePhSiO_{2/2})_{0.80}(PhSiO_{3/2})_{0.10}$
$(HO_{1/2})_{0.02}$ $(ViMe_2SiO_{1/2})_{0.20}(MePhSiO_{2/2})_{0.70}(SiO_{4/2})_{0.10}$
$(HO_{1/2})_{0.01}$ $HOMe_2SiO(MeViSiO)_{20}SiMe_2OH$ $Me_2ViSiO(MePhSiO)_{30}SiMe_2Vi$ $Me_2ViSiO(Me_2SiO)_{150}SiMe_2Vi$

Component ($a_{1-1}$) is preferably used from the viewpoint of imparting hardness and mechanical strength to the obtained cured product. Component ($a_{1-2}$) can be added as an optional component from the viewpoint of imparting toughness to the obtained cured product, but when a crosslinking agent having many chained siloxane units is used in the following component ($a_2$), it may be used instead. In any case, it is preferable that the mass ratio of the component having a large number of branched siloxane units to the component having a large number of chained siloxane units is within the range of 50:50 to 100:0, or within the range of 60:40 to 100:0. This is because the hardness and mechanical strength of the obtained cured product are good when the mass ratio of the component having a large number of branched siloxane units to the component having a large number of chained siloxane units is within the above range.

When component $(a_1)$ is radically reacted by an organic peroxide, component $(a_{1-1})$ and component $(a_{1-2})$ may be reacted within the range of 10:90 to 90:10, and component $(a_2)$ may not be used.

Component $(a_2)$ is a component for crosslinking component $(a_{1-1})$ and/or component $(a_{1-2})$ in the hydrosilylation reaction, and is an organopolysiloxane containing at least two silicon atom bonded hydrogen atoms in one molecule. As a group bonded to a silicon atom other than a hydrogen atom in component $(a_2)$, an alkyl group having 1 to 20 carbon atoms, a halogen-substituted alkyl group having 1 to 20 carbon atoms, an aryl group having 6 to 20 carbon atoms, a halogen-substituted aryl group having 6 to 20 carbon atoms, an aralkyl group having 7 to 20 carbon atoms, an alkoxy group, an epoxy group-containing group, or a hydroxyl group is exemplified, and the same groups as those described above are exemplified.

Such component $(a_2)$ is not limited, but preferably is an organohydrogenpolysiloxane, represented by the average composition formula:

$$R^6_k H_m SiO_{(4-k-m)/2}.$$

In the formulae, $R^6$ is an alkyl group having 1 to 20 carbon atoms, a halogen-substituted alkyl group having 1 to 20 carbon atoms, an aryl group having 6 to 20 carbon atoms, a halogen-substituted aryl group having 6 to 20 carbon atoms, or an aralkyl group having 7 to 20 carbon atoms, and the same groups as the above $R^1$ are exemplified, and preferably a methyl group or a phenyl group.

In the formula, k is a number in the range of 1.0 to 2.5, preferably in the range of 1.2 to 2.3, m is a number in the range of 0.01 to 0.9, preferably in the range of 0.05 to 0.8, and k+m is a number in the range of 1.5 to 3.0, preferably in the range of 2.0 to 2.7.

Component $(a_2)$ may be a resinous organohydrogenpolysiloxane having a large number of branched siloxane units, or the component may be a chained organohydrogenpolysiloxane having a large number of chained siloxane units. Specifically, examples of component $(a_2)$ include an organohydrogenpolysiloxane represented by the following $(a_{2-1})$, an organohydrogenpolysiloxane represented by the following $(a_{2-2})$, or mixtures thereof.

Component $(a_{2-1})$ is a resinous organohydrogenpolysiloxane having a silicon-bonded hydrogen atom represented by the average unit formula:

$$[R^7_3SiO_{1/2}]_f[R^7_2SiO_{2/2}]_g[R^7SiO_{3/2}]_h[SiO_{4/2}]_i (R^5O_{1/2})_j.$$

In the formula, each $R^7$ is independently an alkyl group having 1 to 20 carbon atoms, a halogen-substituted alkyl group having 1 to 20 carbon atoms, an aryl group having 6 to 20 carbon atoms, a halogen-substituted aryl group having 6 to 20 carbon atoms, an aralkyl group having 7 to 20 carbon atoms, or a hydrogen atom, and the same groups as the above $R^1$ are exemplified. Furthermore, in the formula, $R^5$ represents a hydrogen atom or an alkyl group having 1 to 6 carbon atoms, and the same groups as described above are exemplified.

In the formula, f is a number within the range of 0 to 0.7, g is a number within the range of 0 to 0.7, h is a number within the range of 0 to 0.9, i is a number within the range of 0 to 0.7, j is a number within the range of 0 to 0.1, and h+i is a number within the range of 0.3 to 0.9, f+g+h+i is 1, preferably f is a number within the range of 0 to 0.6, g is a number within the range of 0 to 0.6, h is a number within the range of 0 to 0.9, i is a number within the range of 0 to 0.5, j is a number within the range of 0 to 0.05, and h+i is a number within the range of 0.4 to 0.9, f+g+h+i+i is 1.

Component $(a_{2-2})$ is an organopolysiloxane having at least two silicon atom bonded hydrogen atoms in one molecule, expressed by the average unit formula:

$$(R^7_3SiO_{1/2})_{f'}(R^7_2SiO_{2/2})_{g'}(R^7SiO_{3/2})_{h'}(SiO_{4/2})_{i'} (R^5O_{1/2})_{j'}.$$

In the formula, $R^7$ and $R^5$ are the same groups as described above.

In the formula, f' is a number within the range of 0.01 to 0.3, g' is a number within the range of 0.4 to 0.99, h' is a number within the range of 0 to 0.2, i' is a number within the range of 0 to 0.2, j' is a number within the range of 0 to 0.1, and h'+i' is a number within the range of 0 to 0.2, and f'+g'+h'+i' is 1, preferably f' is a number within the range of 0.02 to 0.20, g' is a number within the range of 0.6 to 0.99, h' is a number within the range of 0 to 0.1, i' is a number within the range of 0 to 0.1, j' is a number within the range of 0 to 0.05, and h'+i' is a number within the range of 0 to 0.1, and f'+g'+h'+i' is 1.

As described above, in component $(a_2)$, the resinous organopolysiloxane having many branched siloxane units imparts hardness and mechanical strength to the cured product, and the obtained organopolysiloxane having many chained siloxane units imparts toughness to the cured product, and therefore, it is preferable to appropriately use component $(a_{2-1})$ and component $(a_{2-2})$ as component $(a_2)$. Specifically, when the number of branched siloxane units in component $(a_1)$ is small, it is preferable to mainly use component $(a_{2-1})$ as component $(a_2)$, and when the number of chained siloxane units in component $(a_1)$ is small, it is preferable to mainly use component $(a_{2-2})$. Component $(a_2)$ preferably has a mass ratio of component $(a_{2-1})$ to component $(a_{2-2})$ within the range of 50:50 to 100:0, or within the range of 60:40 to 100:0.

As component $(a_2)$, the following organopolysiloxanes are exemplified. In the formula, Me and Ph represent a methyl group and a phenyl group, respectively.

$Ph_2Si(OSiMe_2H)_2$, i.e., $Ph_{0.67}Me_{1.33}H_{0.67}SiO_{0.67}$ $HMe_2SiO(Me_2SiO)_{20}SiMe_2H$, i.e., $Me_{2.00}H_{0.09}SiO_{0.95}$ $HMe_2SiO(Me_2SiO)_{55}SiMe_2H$, i.e., $Me_{2.00}H_{0.04}SiO_{0.98}$ $PhSi(OSiMe_2H)_3$, i.e., $Ph_{0.25}Me_{1.50}H_{0.75}SiO_{0.75}$ $(HMe_2SiO_{1/2})_{0.6}(PhSiO_{3/2})_{0.4}$, i.e., $Ph_{0.40}Me_{1.20}H_{0.60}SiO_{0.90}$

The amount of component $(a_2)$ to be added is such that the molar ratio of silicon atom bonded hydrogen atoms in component $(a_2)$ to the alkenyl groups in component $(a_1)$ is in an amount of 0.2 to 0.7, preferably in an amount of 0.3 to 0.6. This is because the hardness and the mechanical strength of the obtained cured product are good when the amount of component $(a_2)$ to be added is within the above ranges.

The organic peroxide used for radically reacting component $(a_1)$ is not limited, and the organic peroxides exemplified by component (C) below can be used. In the radical reaction, component $(a_1)$ is preferably a mixture of component $(a_{1-1})$ and component $(a_{1-2})$ in the mass ratio ranging from 10:90 to 90:10. Although the amount of the organic peroxide to be added is not limited, it is preferably within the range of 0.1 to 5 parts by mass, within the range of 0.2 to 3 parts by mass, or within the range of 0.2 to 1.5 parts by mass, based on 100 parts by mass of component ($a_1$).

The hydrosilylation reaction catalyst used for the hydrosilylation reaction of component ($a_1$) and component ($a_2$) is not limited, and a hydrosilylation reaction catalyst exemplified by component (C) below can be used. The amount of the hydrosilylation reaction catalyst to be added is preferably an amount in which platinum-based metal atoms in the hydrosilylation reaction catalyst are within the range of 0.01 to 500 ppm, within the range of 0.01 to 100 ppm, or within the range of 0.01 to 50 ppm in terms of mass units, with regard to the total amount of component ($a_1$) and component ($a_2$).

The above component ($A_3$) is obtained by condensing the following component ($a_3$) and the following component ($a_4$) with a condensation reaction catalyst.

Component ($a_3$) is condensation reactive organopolysiloxane represented by the average unit formula:

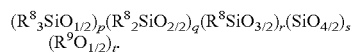

In the formula, each $R_8$ is independently an alkyl group having 1 to 20 carbon atoms, a halogen-substituted alkyl group having 1 to 20 carbon atoms, an alkenyl group having 2 to 20 carbon atoms, an aryl group having 6 to 20 carbon atoms, a halogen-substituted aryl group having 6 to 20 carbon atoms, or an aralkyl group having 7 to 20 carbon atoms, and the same groups as described above are exemplified. Furthermore, in the formula, $R^9$ is a hydrogen atom, an alkyl group having 1 to 6 carbon atoms, or an acyl group having 2 to 5 carbon atoms, and an alkoxy group such as a methoxy group or an ethoxy group and an acyloxy group are exemplified. Component ($a_3$) has at least one silicon atom bonded hydroxyl group, silicon atom bonded alkoxy group, or silicon atom bonded acyloxy group in one molecule. In addition, it is preferable that in one molecule, at least two $R^8$ is an alkenyl group, and 10 mol % or more, or 20 mol % or more of the total $R^8$ is a phenyl group.

In the formula, p is a number within the range of 0 to 0.7, q is a number within the range of 0 to 0.7, r is a number within the range of 0 to 0.9, s is a number within the range of 0 to 0.7, t is a number within the range of 0.01 to 0.10, and r+s is a number within the range of 0.3 to 0.9, p+q+r+s is 1, and preferably p is a number within the range of 0 to 0.6, q is a number within the range of 0 to 0.6, r is a number within the range of 0 to 0.9, s is a number within the range of 0 to 0.5, t is a number within the range of 0.01 to 0.05, and r+s is a number within the range of 0.4 to 0.9. This is because, when p, q, and r+s are each a number within the above range, a hot-melt silicone having flexibility at 25° C. but non-fluidity, low surface tack, and sufficiently low melt viscosity at high temperature is obtained.

Component ($a_4$) is a condensation reactive organopolysiloxane represented by the average unit formula:

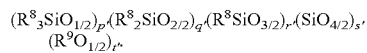

In the formula, $R^8$ and $R^9$ are the same groups as described above. Component ($a_4$) has at least one silicon-bonded hydroxyl group, silicon-bonded alkoxy group, or silicon-bonded acyloxy group in one molecule. In the formula, p' is a number within the range of 0.01 to 0.3, q' is a number within the range of 0.4 to 0.99, r' is a number within the range of 0 to 0.2, s' is a number within the range of 0 to 0.2, t' is a number within the range of 0 to 0.1, and r'+s' is a number within the range of 0 to 0.2, p'+q'+r'+s' is 1, and preferably p' is a number within the range of 0.02 to 0.20, q' is a number within the range of 0.6 to 0.99, r' is a number within the range of 0 to 0.1, s' is a number within the range of 0 to 0.1, t' is a number within the range of 0 to 0.05, and r'+s' is a number within the range of 0 to 0.1. This is because, when p', q', r', and s' are each a number within the above range, a hot-melt silicone having flexibility at 25° C. but non-fluidity, low surface tack, and sufficiently low melt viscosity at high temperature is obtained.

The condensation reaction catalyst for condensation reaction of component ($a_3$) and component ($a_4$) is not limited, and examples thereof include organic tin compounds such as dibutyltin dilaurate, dibutyltin diacetate, tin octenate, dibutyltin dioctate, and tin laurate; organic titanium compounds such as tetrabutyl titanate, tetrapropyl titanate, and dibutoxy bis(ethyl acetoacetate); acidic compounds such as hydrochloric acid, sulfuric acid, and dodecylbenzene sulfonic acid; alkaline compounds such as ammonia and sodium hydroxide; amine-based compounds such as 1,8-diazabicyclo[5.4.0]undecene (DBU), 1,4-diazabicyclo[2.2.2]octane (DABCO), and preferably an organic tin compound, and an organic titanium compound.

Component ($A_3$) is a block copolymer composed of a resinous organosiloxane block and a chained organosiloxane block. Such component ($A_3$) is preferably comprised of 40 to 90 mol % of disiloxy units of the formula [$R^1_2SiO_{2/2}$], 10 to 60 mol % of trisiloxy units of the formula [$R^1SiO_{3/2}$], and preferably contains 0.5 to 35 mol % of silanol groups [≡SiOH]. Here, each $R^1$ is independently an alkyl group having 1 to 20 carbon atoms, a halogen-substituted alkyl group having 1 to 20 carbon atoms, an alkenyl group having 2 to 20 carbon atoms, an aryl group having 6 to 20 carbon atoms, a halogen-substituted aryl group having 6 to 20 carbon atoms, or an aralkyl group having 7 to 20 carbon atoms, and the same groups as described above are exemplified. At least two $R^1$ in one molecule is an alkenyl group. Further, component ($A_3$) is a resinous organosiloxane block copolymer in which the disiloxy unit [$R^1_2SiO_{2/2}$] forms a linear block having on average 100 to 300 disiloxy units per one linear block; the trisiloxy unit [$R^1SiO_{3/2}$] forms a non-linear block having a molecular weight of at least 500 g/mol; at least 30% of the non-linear blocks are bonded to each other; each linear block is bonded to at least one non-linear block via a —Si—O—Si— linkage; the resinous organosiloxane block copolymer having a mass-average molecular weight of at least 20000 g/mol, and containing at least one alkenyl group of 0.5 to 4.5 mol %.

Component ($A_3$) is prepared by condensation reaction of ($a_5$) a resinous organosiloxane or a resinous organosiloxane block copolymer with ($a_6$) a chained organosiloxane, and optionally ($a_7$) a siloxane compound.

Component ($a_5$) is a resinous organopolysiloxane, expressed by the average unit formula:

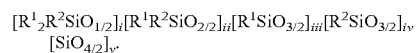

In the formula, each $R_1$ is independently an alkyl group having 1 to 20 carbon atoms, a halogen-substituted alkyl group having 1 to 20 carbon atoms, an alkenyl group having 2 to 20 carbon atoms, an aryl group having 6 to 20 carbon atoms, a halogen-substituted aryl group having 6 to 20 carbon atoms, or an aralkyl group having 7 to 20 carbon atoms, and the same groups as described above are exemplified. In addition, in the formula, each $R^2$ is independently an alkyl group having 1 to 20 carbon atoms, a halogen-substituted alkyl group having 1 to 20 carbon atoms, an aryl group having 6 to 20 carbon atoms, a halogen-substituted aryl group having 6 to 20 carbon atoms, or an aralkyl group having 7 to 20 carbon atoms, and the same groups as the $R^1$ are exemplified.

Also, in the formula, i, ii, iii, iv, and v represent the mole fraction of each siloxy unit, i is a number from 0 to 0.6, ii is a number from 0 to 0.6, iii is a number from 0 to 1, iv is a number from 0 to 1, and v is a number from 0 to 0.6, with the proviso that (ii+iii+iv+v)>0 and (i+ii+iii+iv+v) s 1. In addition, component ($a_5$) preferably contains 0 to 35 mol % of a silanol group [≡SiOH] in one molecule.

Component ($a_6$) is a straight-chain organosiloxane represented by the general formula:

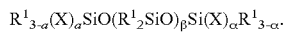

$$R^1{}_{3-a}(X)_a SiO(R^1{}_2 SiO)_\beta Si(X)_a R^1{}_{3-a}.$$

In the formula, $R^1$ is the same as described above, and the same groups as described above are exemplified. In addition, in the formula, X is a hydrolyzable group selected from —$OR^5$, F, Cl, Br, I, —$OC(O)R^5$, —$N(R^5)_2$, or —ON=$CR^5{}_2$, (wherein $R^5$ is a hydrogen atom or an alkyl group having 1 to 6 carbon atoms). Furthermore, in the formula, a is independently 1, 2, or 3, and β is an integer of 50 to 300.

Component ($a_7$) is a siloxane compound expressed by general formula:

$$R^1 R^2{}_2 SiX.$$

In the formula, $R^1$, $R^2$, and X are the same groups as described above.

The condensation reaction catalyst for condensation reaction of component ($a_5$) and component ($a_6$) and/or component ($a_7$) is not limited, and examples thereof include organic tin compounds such as dibutyltin dilaurate, dibutyltin diacetate, tin octenate, dibutyltin dioctate, and tin laurate; organic titanium compounds such as tetrabutyl titanate, tetrapropyl titanate, and dibutoxy bis(ethyl acetoacetate); acidic compounds such as hydrochloric acid, sulfuric acid, and dodecylbenzene sulfonic acid; alkaline compounds such as ammonia and sodium hydroxide; and amine-based compounds such as 1,8-diazabicyclo[5.4.0]undecene (DBU), 1,4-diazabicyclo[2.2.2]octane (DABCO).

Component (A) preferably exhibits hot-melt properties, and specifically, is preferably non-fluid at 25° C. and has a melt viscosity of not greater than 8000 Pa·s at 100° C., as measured with a rotational viscometer such as a rheometer. Non-fluid refers to not flowing in a no-load condition, for example, the state of being lower than the softening point measured by the softening point testing method in the ball and ring method of hot melt adhesives specified in "Testing methods for the softening point of hot melt adhesives" of JIS K 6863-1994. That is, in order to be non-fluid at 25° C., the softening point must be higher than 25° C.

Component (A) preferably has a melt viscosity at 100° C. of 8000 Pa·s or less, 5000 Pa·s or less, or within the range of 10 to 3000 Pa·s. Moreover, when the melt viscosity at 100° C. is within the abovementioned range, favorable adhesiveness after being hot melted and then cooled at 25° C. is obtained.

As long as component (A) is in the form of fine particles, the particle diameter is not limited, but the average primary particle diameter is preferably within the range of 1 to 5000 µm, within the range of 1 to 500 µm, within the range of 1 to 100 µm, within the range of 1 to 20 µm, or within the range of 1 to 10 µm. The average primary particle diameter can be obtained, for example, by observation with an optical microscope or an SEM. The shape of component (A) is not limited, and a spherical shape, a spindle shape, a plate shape, a needle shape, and an irregular shape are exemplified, and it is preferable to have a spherical shape or a true spherical shape because it melts uniformly.

In particular, by setting component (A) to have a true spherical shape of 1 to 10 µm, it is possible to improve the melting characteristics of the present composition and further to reduce the average linear expansion coefficient after curing.

The method for producing component (A) is not limited, and a known method can be used. For example, component (A) is simply atomized, or at least two kinds of organopolysiloxanes are crosslinked and the reactants are atomized simultaneously or separately.

As a method for finely-pulverizing the obtained silicone after crosslinking at least two kinds of organopolysiloxanes, for example, a method of pulverizing the silicone using a pulverizer or a method of directly pulverizing the silicone in the presence of a solvent can be cited. The pulverizer may be, for example, but not limited to, a roll mill, a ball mill, a jet mill, a turbo mill, or a planetary mill. As a method of directly atomizing the silicone in the presence of a solvent, for example, spraying by a spray dryer, or atomization by a biaxial kneader or a belt dryer can be cited. In the present invention, it is particularly preferable to use true-spherical hot-melt silicone fine particles obtained by spraying with a spray dryer from the viewpoints of melting characteristics of the hard granular compound, the average linear expansion coefficient of the cured product, efficiency in manufacturing and handling workability of the composition.

By using a spray dryer or the like, component (A) having a true spherical shape and an average primary particle diameter of 1 to 10 µm can be produced. The heating and drying temperature of the spray dryer needs to be appropriately set based on the heat resistance of the silicone fine particles and the like. In order to prevent secondary aggregation of the silicone fine particles, it is preferable to control the temperature of the silicone fine particles to be equal to or lower than the glass transition temperature thereof. The silicone fine particles thus obtained can be recovered by a cyclone, a bag filter, or the like.

In order to obtain a uniform component (A), a solvent may be used in the above-mentioned step within the range that does not inhibit the curing reaction. Examples of the solvents include, but are not limited to, aliphatic hydrocarbons such as n-hexane, cyclohexane, and n-heptane; aromatic hydrocarbons such as toluene, xylene, and mesitylene; ethers such as tetrahydrofuran and dipropyl ether; silicones such as hexamethyldisiloxane, octamethyltrisiloxane, and decamethyltetrasiloxane; esters such as ethyl acetate, butyl acetate, and propylene glycol monomethyl ether; and ketones such as acetone, methyl ethyl ketone, and methyl isobutyl ketone.

Component (B) of the present invention is an inorganic filler and it is possible to provide a curable particulate silicone composition which cures to give a cured product excellent in hardness and toughness from room temperature to high temperature. In the present invention, from the perspective of achieving a low average linear expansion coefficient for the obtained cured product, the content of component (B) must be in the range of from 87 to 95 vol. % of the entire composition and is preferably in the range of from 88 to 93 vol. % and more preferably within the range of from 88 to 92 vol. % of the entire composition.

In order to achieve the aforementioned compounded amount and to achieve a low average linear expansion coefficient for the obtained cured product, component (B) is preferably treated with a specific surface treatment agent— in particular, a surface treatment agent at 0.1 to 2.0 mass %, 0.1 to 1.0 mass %, or 0.2 to 0.8 mass % relative to the mass of the entire component (B). By treating component (B) with a surface treatment agent in the treatment amount described above, there is an advantage that component (B) can be stably compounded in the composition at a high vol. %. In addition, the surface treatment method is optional, and a desired method such as a uniform mixing method using mechanical force (dry), a wet mixing method using a solvent, or the like can be used.

Examples of these surface treatment agents include methylhydrogenpolysiloxane, silicone resins, metal soaps, silane coupling agents, and fluorine compounds such as perfluoroalkylsilane and perfluoroalkylphosphate ester salts, however, the silicone-based surface treatment agents described below are particularly preferable. Note that when a silane-based surface treatment agent such as methyltrimethoxysilane or phenyltrimethoxysilane is selected as the surface treatment agent of component (B), the hot melt properties of the entire composition may be diminished, and component (B) may not be stably compounded to the content indicated by the vol. % described above. Furthermore, when an alkyltrialkoxysilane having a long-chain alkyl group such as an octyl group is selected as a surface treatment agent, it tends to be possible to maintain the hot melt properties of the composition and the compounding stability of component (B), however, the strength of the cured product obtained by curing the composition of the present invention may be negatively affected, which may cause cracking or molding defects.

An example of a suitable silicone-based surface treatment agent is a silicone-based surface treatment agent having at least one polysiloxane structure and a hydrolyzable silyl group in the molecule. In particular, it is preferable to use a silicone-based surface treatment agent having at least one polysiloxane structure and a hydrolyzable silyl group in the molecule, and examples thereof are organopolysiloxanes having a straight-chain alkoxysilyl terminal represented by structural formula (1):

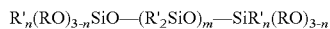

or

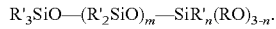 structural formula (2):

In the formulas, R is a hydrogen atom or an alkyl group having 1 to 3 carbon atoms (=a methyl group, an ethyl group, or a propyl group); each R' is independently an alkyl group having 1 to 20 carbon atoms, a halogen-substituted alkyl group having 1 to 20 carbon atoms, an alkenyl group having 2 to 20 carbon atoms, an aryl group having 6 to 20 carbon atoms, a halogen-substituted aryl group having 6 to 20 carbon atoms, or an aralkyl group having 7 to 20 carbon atoms, and the same groups as those described above are exemplified. n is a number in the range of 0 to 2; m is a number in the range of 2 to 200; and m may be a number in the range of 2 to 150.

Such component (B) is preferably at least one filler which does not have a softening point or does not soften below the softening point of the component (A), and may be a component which improves the handling workability of the composition and imparts mechanical properties and other properties to the cured product of the composition. Examples of component (B) include inorganic fillers, organic fillers, and mixtures thereof, and inorganic fillers are preferable. Examples of this inorganic filler include reinforcing fillers, white pigments, thermally conductive fillers, conductive fillers, phosphors, and mixtures of at least two types thereof, and the composition preferably contains a reinforcing filler or a thermally conductive filler having an average particle diameter of 10.0 μm or more. Examples of the organic filler include a silicone resin filler, a fluorine resin filler, and a polybutadiene resin filler. The shape of these fillers is not particularly limited, and may be spherical, spindle-shaped, flat, needle-shaped, amorphous, or the like.

Component (B) is preferably an inorganic filler having an average particle diameter of 10.0 μm or more, and in particular, since the hardness at room temperature to high temperature and the rate of change in storage modulus are small, it is particularly preferable that component (B) is a spherical inorganic filler having an average particle diameter of 10.0 μm or more. In addition, by using an inorganic filler larger than the particle diameter of component (A), the inorganic filler can form good packing at the time of melting, so that it is possible to greatly reduce the average linear expansion coefficient. Such an inorganic filler can be blended or filled in a relatively large amount with respect to component (A), and there is a practical advantage that the mechanical strength of the cured product can be further improved. On the other hand, it is possible and preferable to blend an inorganic filler or an organic filler having an average particle diameter of 5 μm or less for the purpose of imparting or improving the light reflection property, conductivity, thermal conductivity, fluorescent property, stress relaxation property, etc. of the composition of the present invention.

When the present composition is used for applications such as sealants, protective agents, adhesives, light reflecting materials, etc., since it imparts mechanical strength to the cured product and improves the protective property or adhesiveness, it is preferable to incorporate a reinforcing filler as component (B). Examples of the reinforcing filler include fumed silica, precipitated silica, fused silica, calcined silica, fumed titanium dioxide, quartz, calcium carbonate, diatomaceous earth, aluminum oxide, aluminum hydroxide, zinc oxide, and zinc carbonate. These reinforcing fillers may also be surface treated with organoalkoxysilanes such as methyltrimethoxysilane; organohalosilanes such as trimethylchlorosilane; organosilazanes such as hexamethyldisilazane; siloxane oligomers such as α,ω-silanol group-blocked dimethylsiloxane oligomers, α,ω-silanol group-blocked methylphenylsiloxane oligomers, α,ω-silanol group-blocked methylvinylsiloxane oligomers, and the like. Further, as the reinforcing filler, a fibrous filler such as calcium metasilicate, potassium titanate, magnesium sulfate, sepiolite, zonolite, aluminum borate, rock wool, glass fiber, or the like may be used.

In particular, from the viewpoint of imparting the hardness of the cured product at room temperature to high temperature, component (B) is preferably spherical silica or aluminum oxide (alumina) having an average particle diameter of 10.0 μm or more.

Component (B) may contain silicone fine particles which do not correspond to component (A), and the stress relaxation characteristics and the like can be improved or adjusted as desired. Silicone fine particles include non-reactive silicone resin fine particles and silicone elastomer fine particles, but silicone elastomer fine particles are suitably exemplified from the standpoint of improving flexibility or stress relaxation properties.

The silicone elastomer fine particles are a crosslinked product of linear diorganopolysiloxane comprised of primarily of diorganosiloxy units (D-units). The silicone elastomer fine particles can be prepared by a crosslinking reaction of diorganopolysiloxane by a hydrosilylation reaction, a condensation reaction of a silanol group, or the like, and in particular, the silicone elastomer fine particles can be suitably obtained by a crosslinking reaction of organohydrogenpolysiloxane having a silicon bonded hydrogen atom at a side chain or a terminal with diorganopolysiloxane having an unsaturated hydrocarbon group such as an alkenyl group at a side chain or a terminal under a hydrosilylation reaction catalyst. The silicone elastomer fine particles may have various shapes such as spherical, flat, and irregular shapes, but are preferably spherical in terms of dispersibility, and among these, true spherical is more preferable. Commercially available products of such silicone elastomer fine particles (B) include, for example, "Torefil-E series" and "EP Powder series" manufactured by Dow Corning Toray Company, Ltd., and "KMP series" manufactured by Shin-Etsu Chemical Co., Ltd. The silicone elastomer fine particles may be subjected to a surface treatment.

When the present composition is used as a wavelength conversion material for an LED, a phosphor may be blended as component (B) to convert the emission wavelength from the optical semiconductor element. There is no particular limitation on this phosphor, and examples of the phosphor include yellow, red, green, and blue light phosphors, which include oxide phosphors, oxynitride phosphors, nitride phosphors, sulfide phosphors, oxysulfide phosphors, and the like, which are widely used in light emitting diodes (LED). Examples of the oxide phosphors include yttrium, aluminum, and garnet-type YAG green to yellow light phosphors containing cerium ions; terbium, aluminum, and garnet-type TAG yellow light phosphors containing cerium ions; and silicate green to yellow light phosphors containing cerium or europium ions. In addition, exemplary oxynitride phosphors include silicon, aluminum, oxygen, and nitrogen type SiAlON red to green light phosphors containing europium ions. Exemplary nitride phosphors include calcium, strontium, aluminum, silicon, and nitrogen type CASN red light phosphors containing europium ions. Exemplary sulfide phosphors include ZnS green light phosphors containing copper ions or aluminum ions. Exemplary oxysulfide phosphors include $Y_2O_2S$ red light phosphors containing europium ions. In the composition, two or more of these phosphors may be used in combination.

In addition, the composition may contain a thermally conductive filler or a conductive filler to impart thermal or electrical conductivity to the cured product. As the thermally conductive filler or the conductive filler, there are exemplified a metal fine powder such as gold, silver, nickel, copper, aluminum; a fine powder obtained by depositing or plating a metal such as gold, silver, nickel, copper or the like on the surface of a fine powder such as ceramic, glass, quartz, organic resin or the like; a metal compound such as aluminum oxide, magnesium oxide, aluminum nitride, boron nitride, zinc oxide or the like; graphite, and a mixture of two or more of these. When electrical insulation is required for the present composition, a metal oxide-based powder or a metal nitride-based powder is preferable, and in particular, an aluminum oxide powder, a zinc oxide powder, or an aluminum nitride powder is preferable.

The content of component (B) must satisfy the vol. % range described above, but the component may be compounded within the range of from 100 to 4000 parts by mass, within the range of from 250 to 4000 parts by mass, or within the range of from 500 to 4000 parts by mass with respect to 100 parts by mass of component (A). In particular, component (B) of the present invention preferably contains an inorganic filler having an average particle diameter of 10.0 µm or more, particularly a spherical inorganic filler, and not less than 90 mass % or not less than 92 mass % of the entire composition of the present invention is preferably the component (B) described above, in that, even if blended in a relatively large amount relative to component (A), the handling workability of the composition does not deteriorate and the obtained cured product has an excellent average linear expansion coefficient and mechanical strength at room temperature to a high temperature.

Component (C) is a curing agent for curing component (A), and is not limited as long as component (A) can be cured. When component (A) has an alkenyl group, component (C) is an organohydrogenpolysiloxane having at least two silicon atom bonded hydrogen atoms in one molecule and a hydrosilylation reaction catalyst, when component (A) contains an alkenyl group and contains a hydrosilylation reaction catalyst, component (C) may be only an organopolysiloxane having at least two silicon atom bonded hydrogen atoms in one molecule, but a hydrosilylation reaction catalyst may be used in combination. In addition, when component (A) has an alkenyl group, component (C) may be an organic peroxide, but an organopolysiloxane having at least two silicon atom bonded hydrogen atoms may be used in combination in one molecule. On the other hand, when component (A) has a silicon atom bonded hydrogen atom, component (C) is an organopolysiloxane having at least two alkenyl groups in one molecule and a hydrosilylation reaction catalyst, when component (A) has a silicon atom bonded hydrogen atom and contains a hydrosilylation reaction catalyst, component (C) may be an organopolysiloxane having at least two alkenyl groups in one molecule, but a hydrosilylation reaction catalyst may be used in combination.

Examples of organopolysiloxanes in component (C) include organopolysiloxanes containing alkenyl groups represented by the above ($a_1$) and/or the above ($a_2$), or organopolysiloxanes containing silicon atom bonded hydrogen atoms represented by the above ($a_3$) and/or the above ($a_4$).

When an organopolysiloxane is used as component (C), the content thereof is not limited, but for curing the composition, it is preferable that the amount of silicon atom bonded hydrogen atoms is within the range of 0.5 to 20 mol or within the range of 1.0 to 10 mol with regard to 1 mol of alkenyl group in the composition.

As the hydrosilylation reaction catalyst, platinum-based catalysts, rhodium-based catalysts, and palladium-based catalysts are exemplified, and platinum-based catalysts are preferable because the curing of the present composition can be remarkably accelerated. Examples of the platinum-based catalyst include platinum fine powder, chloroplatinic acid, an alcohol solution of chloroplatinic acid, a platinum-alkenyl siloxane complex, a platinum-olefin complex, a platinum-carbonyl complex, and a catalyst in which these platinum-based catalysts are dispersed or encapsulated with a thermoplastic resin such as silicone resin, polycarbonate resin, acrylic resin or the like, with a platinum-alkenyl siloxane complex particularly preferable. Examples of this alkenyl siloxane include: 1,3-divinyl-1,1,3,3-tetramethyldisiloxane; 1,3,5,7-tetramethyl-1,3,5,7-tetravinylcyclotetrasiloxane; an alkenyl siloxane obtained by substituting part of methyl groups of these alkenyl siloxanes with an ethyl group, a phenyl group, etc.; and an alkenyl siloxane obtained by substituting part of vinyl groups of these alkenyl siloxanes with an allyl group, a hexenyl group, etc. In particular, 1,3-divinyl-1,1,3,3-tetramethyldisiloxane is preferable because the platinum-alkenyl siloxane complex has good stability. In addition, in terms of improving the handleability as well as the pot life of the composition, a platinum containing hydrosilylation reaction catalyst in fine particles dispersed and encapsulated with thermoplastic resin may be used. As the catalyst for promoting the hydrosilylation reaction, a non-platinum based metal catalyst such as iron, ruthenium, iron/cobalt, or the like may be used.

The amount of the hydrosilylation reaction catalyst to be added is preferably an amount in which the metal atom is within the range of 0.01 to 500 ppm, an amount within the range of 0.01 to 100 ppm, or an amount within the range of 0.01 to 50 ppm in terms of mass units with regard to component (A).

Examples of organic peroxides include alkyl peroxides, diacyl peroxides, ester peroxides, and carbonate peroxides.

Examples of alkyl peroxides include dicumyl peroxide, di-tert-butyl peroxide, di-tert-butylcumyl peroxide, 2,5-dimethyl-2,5-di(tert-butylperoxy)hexane, 2,5-dimethyl-2,5-di(tert-butylperoxy)hexyne-3, tert-butylcumyl, 1,3-bis(tert-butylperoxyisopropyl)benzene, and 3,6,9-triethyl-3,6,9-trimethyl-1,4,7-triperoxonan.

Examples of diacyl peroxides include benzoyl peroxide, lauroyl peroxide, and decanoyl peroxide.

Examples of ester peroxides include 1,1,3,3-tetramethylbutylperoxyneodecanoate, α-cumylperoxyneodecanoate, tert-butylperoxyneodecanoate, tert-butylperoxyneoheptanoate, tert-butylperoxypivalate, tert-hexylperoxypivalate, 1,1,3,3-tetramethylbutylperoxy-2-ethylhexanoate, tert-amylperoxyl-2-ethylhexanoate, tert-butylperoxy-2-ethylhexanoate, tert-butylperoxyisobutyrate, di-tert-butylperoxyhexahydroterephthalate, tert-amylperoxy-3,5,5-trimethylhexanoate, tert-butylperoxy-3,5,5-trimethylhexanoate, tert-butylperoxyacetate, tert-butylperoxybenzoate, and di-butylperoxytrimethyladipate.

Examples of carbonate peroxides include di-3-methoxybutyl peroxydicarbonate, di(2-ethylhexyl)peroxydicarbonate, diisopropyl peroxycarbonate, tert-butyl peroxyisopropylcarbonate, di(4-tert-butylcyclohexyl)peroxydicarbonate, dicetyl peroxydicarbonate, and dimyristyl peroxydicarbonate.

This organic peroxide preferably has a 10-hour half-life temperature of not lower than 90° C. or not lower than 95° C. Examples of such organic peroxide include dicumyl peroxide, di-tert-butyl peroxide, di-tert-hexyl peroxide, tert-butylcumyl peroxide, 2,5-dimethyl-2,5-di(tert-butylperoxy)hexane, 1,3-bis(tert-butylperoxyisopropyl)benzene, di-(2-tert-butylperoxyisopropyl)benzene, and 3,6,9-triethyl-3,6,9-trimethyl-1,4,7-triperoxonan.

While not limited thereto, the content of organic peroxide is preferably within the range of 0.05 to 10 parts by mass, or within the range of 0.10 to 5.0 parts by mass, with regard 25 to 100 parts by mass of component (A).

The present composition may contain a curing retardant or an adhesion imparting agent as other optional components as long as the object of the present invention is not impaired.

Examples of the curing retardant include: alkyne alcohols such as 2-methyl-3-butyne-2-ol, 3,5-dimethyl-1-hexyne-3-ol, 2-phenyl-3-butyne-2-ol, and 1-ethynyl-1-cychlohexanol; enyne compounds such as 3-methyl-3-pentene-1-yne, and 3,5-dimethyl-3-hexene-1-yne; alkenyl group-containing low molecular weight siloxanes such as tetramethyltetravinylcyclotetrasiloxane and tetramethyltetrahexenylcyclotetrasiloxane; and alkynyloxysilanes such as methyl tris(1,1-dimethyl propynyloxy)silane and vinyl tris(1,1-dimethyl propynyloxy)silane. The content of the curing retardant is not limited, but is preferably within the range of 10 to 10,000 ppm in terms of mass units, with regard to the composition.

As the adhesion imparting agent, an organosilicon compound having at least one alkoxy group bonded to a silicon atom in one molecule is preferable. Examples of this alkoxy group include a methoxy group, an ethoxy group, a propoxy group, a butoxy group, and a methoxyethoxy group, with a methoxy group particularly preferable. Moreover, examples of groups other than alkoxy group, bonded to the silicon atom of the organosilicon compound include: halogen substituted or unsubstituted monovalent hydrocarbon groups such as an alkyl group, an alkenyl group, an aryl group, an aralkyl group, and a halogenated alkyl group; glycidoxyalkyl groups such as a 3-glycidoxypropyl group and a 4-glycidoxybutyl group; epoxycyclohexylalkyl groups such as a 2-(3,4-epoxycyclohexyl)ethyl group and a 3-(3,4-epoxycyclohexyl)propyl group; epoxyalkyl groups such as a 3,4-epoxybutyl group and a 7,8-epoxyoctyl group; acryl group-containing monovalent organic groups such as a 3-methacryloxypropyl group; and hydrogen atoms. This organosilicon compound preferably has a group that may react with an alkenyl group or a silicon atom-bonded hydrogen atom in this composition, and specifically, preferably has a silicon atom-bonded hydrogen atom or an alkenyl group. Moreover, because favorable adhesion can be imparted to various substrates, this organosilicon compound preferably has at least one epoxy group-containing monovalent organic group per one molecule. Examples of such an organosilicon compound include an organosilane compound, an organosiloxane oligomer, and an alkyl silicate. Exemplary molecular structures of this organosiloxane oligomer or alkyl silicate include a linear structure, a partially branched linear structure, a branched structure, a cyclic structure, and a network structure, among which a linear structure, a branched structure, and a network structure are particularly preferable. Examples of an organosilicon compound include: silane compounds such as 3-glycidoxypropyltrimethoxysilane, 2-(3,4-epoxycyclohexyl)ethyltrimethoxysilane, and 3-methacryloxypropyltrimethoxysilane; siloxane compounds having at least one silicon atom-bonded alkenyl group or at least one silicon atom-bonded hydrogen atom and at least one silicon atom-bonded alkoxy group; mixtures of silane compounds or siloxane compounds having at least one silicon atom-bonded alkoxy group and siloxane compounds having at least one silicon atom-bonded hydroxy group and at least one silicon atom-bonded alkenyl group in one molecule; methylpolysilicate; ethylpolysilicate; and an epoxy group-containing ethylpolysilicate. The adhesion imparting agent is preferably in the form of a low viscosity liquid, and the viscosity thereof is not limited, but is preferably within the range of 1 to 500 mPa·s at 25° C. In addition, while not limited thereto, the content of this adhesion imparting agent is preferably within the range of 0.01 to 10 parts by mass with regard to 100 parts by mass of the total of the present composition.

Further, as long as the object of the present invention is not impaired, the present composition may contain, as other optional ingredients, at least one liquid organopolysiloxane of the above (a1) to (a4); a heat-resistant agent such as iron oxide (red iron oxide), cerium oxide, cerium dimethylsilanoate, fatty acid cerium salt, cerium hydroxide, and zirconium compounds; a release agent such as carnauba wax, montan wax, calcium stearate, calcium montanate, magnesium stearate, magnesium montanate, zinc stearate, zinc montanate, ester wax, and olefinic wax; and other agents such as dyes, non-white pigments, flame retardants, and the like.

The cured product obtained by curing the composition described above may be given an average linear expansion coefficient of not greater than 15 ppm/° C., from 5 to 14 ppm/° C., or from 10 to 14 ppm/° C. within the range of from 250° C. to 200° C. by compounding component (B) in a stably large amount while maintaining the hot melt properties of the entire composition.

In addition, the cured product obtained by curing the composition described above may be designed to provide a cured product in which the ratio ($G'_{-50}/G'_{250}$) of the storage modulus at −50° C. ($G'_{-50}$) to the storage modulus at 250° C. ($G'_{250}$) is within the range of from 1/1 to 1/50. In recent years, particularly the use of power semiconductors has been rapidly expanding, application is required also in regions and applications where there is a large difference in the temperature compared to the past, but the cured product according to the present invention has a practical advantage in that it can maintain stable physical properties even under such low to high temperature conditions and can protect semiconductor elements and the like.

The low average linear expansion coefficient in the range of 25° C. to 200° C. of the cured product obtained by curing the above composition means that the cured product is hardly deformed at room temperature to high temperature and maintains a constant hardness to some extent. For this reason, the cured product obtained by curing the composition according to the present invention is useful in that it is hard, tough, and changes in hardness are small at both room temperature (25° C.) and high temperature (200° C.), and therefore, it is difficult to cause defects such as breakage, deformation, peeling, and gap (void) during molding including the cooling process. The above composition is particularly suitable for overmold molding applications, and the cured product preferably has an average linear expansion coefficient of not greater than 15 ppm/° C. or not greater than 14 ppm/° C. in the range of from 25° C. to 200° C.

The cured product obtained by curing the composition described above may further be such that the ratio ($G'_{-50}/G'_{250}$) of the storage modulus at −50° C. ($G'_{-50}$) to the storage modulus at 250° C. ($G'_{250}$) is within the range of from 1/1 to 1/50. That is, the cured product is useful in that the change of the storage modulus does not greatly change from a low temperature (−50° C.) to a high temperature (250° C.) and the decrease of the storage modulus remains in the range of 1/50 or less, so that the toughness of the cured product does not change from a low temperature to a high temperature, and defects such as breakage, cracking, deformation, peeling, and gap (void) of the cured product due to the temperature change are hardly generated in the cured product after sealing the semiconductor or the circuit element, for example. From the viewpoint of the application and durability of the semiconductor sealant and the like, the cured product preferably has a ratio of the storage modulus at −50° C. ($G'_{-50}$) to the storage modulus at 250° C. ($G'_{250}$), ($G'_{-50}/G'_{250}$) in the range of 1/5 to 1/45, and particularly preferably in the range of 1/10 to 1/40.

In addition, it is preferable that the cured product obtained by curing the above composition does not have a definite inflection point in the change of the linear expansion coefficient (TMA curve) in the range of 20° C. to 300° C., preferably in the range of 25° C. to 200° C. More preferably, even when the storage modulus changes in the range of −50° C. to 250° C., it is preferable not to have a definite inflection point. By selecting the combination of component (A) and component (B), it is possible to design a composition providing a cured product exhibiting such a behavior of an average linear expansion coefficient and a storage modulus, and the obtained composition is less likely to cause defects such as breakage, cracking, deformation, peeling, and gap (voids) of the cured product during molding or in response to a temperature shock because the change in hardness and softness are constant with respect to temperature. Therefore, even when used as a sealant or a protective material of a power semiconductor device used under severe temperature conditions, initial overmold molding can be stably and efficiently performed, and the semiconductor element and the circuit board can be protected for a long period of time, and deterioration of the semiconductor element and the circuit board can be suppressed to realize along life.

The present composition may be used in pellet form. The pellets of the present composition are obtained by compression molding the present composition, and are excellent in handling workability and curability. The "pellet" may also be referred to as a "tablet". The shape of the pellet is not limited, but is usually spherical, elliptical spherical, or cylindrical. The size of the pellet is not limited, and for example, the pellet has an average particle diameter or a circle equivalent diameter of 500 μm or more.

The composition may be molded into a sheet and used. For example, a sheet made of a curable particulate silicone composition having an average thickness of not less than 500 μm, and preferably a few mm, is advantageous in that it has hot melt properties and heating-curability at high temperatures, so it demonstrates excellent handling workability and melting characteristics when used in compression molding or the like.

The composition is non-fluid at 25° C. Here, the term "non-fluid" means that it is not deformed or flowed in a no-load condition, and it is preferable that it is not deformed or flowed in a no-load condition at 25° C. when it is molded into a pellet, a tablet, or the like. Such non-fluid can be evaluated, for example, by placing a molded product of the composition on a hot plate at 25° C. and substantially not deforming or flowing under no load or constant weight. This is because, when non-fluid at 25° C., shape retention at this temperature is good and the surface tackiness is low.

The softening point of the composition is preferably 100° C. or less. Such a softening point means a temperature at which the deformation amount in the height direction is 1 mm or more when the deformation amount of the composition is measured after the load is removed by continuing to press the hot plate with a load of 100 grams for 10 seconds from above.

The present composition tends to decrease in viscosity rapidly under high temperature and high pressure (that is, in the molding step), and a value measured at a similar high temperature and high pressure is preferably used as a useful melt viscosity value. Therefore, the melt viscosity of the present invention is more preferably measured under high pressure using a Koka-type flow tester (manufactured by the Shimadzu Corporation) than when measured with a rotational viscometer such as a rheometer. Specifically, the melt viscosity of the present composition at 180° C. is preferably not greater than 200 Pa·s, more preferably not greater than 100 Pa·s, and particularly preferably from 30 to 100 Pa·s. This is because the adhesiveness to the base material after the composition is hot-melted and then cooled to 25° C. is good.

In the present composition, since component (B) can be filled in a relatively large amount and a high amount with respect to component (A), it is excellent in handling workability, and in particular, it is excellent in handling workability and moldability during overmold molding. Such a composition preferably does not have a definite glass transition point (Tg) in the range of 25° C. to 200° C., and it is preferable that breakage or defects do not occur during overmold molding due to rapid liquefaction.

The curing characteristics of the present composition can be designed as desired and evaluated using a rheometer. The curing characteristics of the present composition can be evaluated based on the values of $T_1$ and $T_{90}$ for the times (seconds) at which the 1% torque value and the 90% torque value are obtained, respectively, when the torque value after 3 minutes at a constant temperature of 150 to 180° C. is set to 100. The present composition preferably has the $T_1$ of 20 seconds or more, or 25 seconds or more, as measured at a constant temperature of 150 to 180° C. In addition, the composition preferably has the $T_{90}$ of 145 seconds or less, or 140 seconds or less, as measured at a temperature of 150 to 180° C. The rheometer used for the measurements is exemplified by a rheometer MDR2000 (manufactured by Alpha Technologies, Inc.).

[Method of Producing Curable Particulate Silicone Composition]

The present composition can be produced by powder-mixing components (A) to (C) and other optional components at a temperature lower than the softening point of component (A). The powder mixer used in the present manufacturing method is not limited, and exemplified are a uniaxial or biaxial continuous mixer, a two-roll mixer, a ROSS mixer, a Hobart mixer, a dental mixer, a planetary mixer, a kneader mixer, a laboratory mill, a small-sized mill, and a henschel mixer, and preferably, a laboratory mill and a henschel mixer.

[Method of Molding Cured Product]

The composition can be cured by a method comprising at least the following steps (I) to (III).

(I) a step of heating and melting the present composition to the softening point of component (A) or higher;

(II) a step of injecting the curable silicone composition obtained in step (I) into a mold or a step of distributing the curable silicone composition obtained in step (I) to a mold by clamping; and (III) a step of curing the curable silicone composition injected in step (II).

As described above, the composition of the present invention is hard and tough at a low temperature to a high temperature of the cured product, exhibits characteristic behavior of an average linear expansion coefficient and a storage modulus, and is excellent in handling workability and curing characteristics, it is particularly suitable for overmold molding for semiconductor elements and the like.

In the above steps, a transfer molding machine, a compression molding machine, an injection molding machine, an auxiliary ram molding machine, a slide molding machine, a double ram molding machine, a low pressure sealing molding machine, or the like can be used. In particular, the composition of the present invention can be suitably used for the purpose of obtaining a cured product by transfer molding and compression molding.

In particular, a sheet obtained by molding the composition of the present invention is useful as a material for compression molding.

Finally, in step (III), the curable silicone composition injected (applied) in step (II) is cured. When an organic peroxide is used as component (C), the heating temperature is preferably 150° C. or higher or 170° C. or higher.

Since it is suitable as a protective member for a semiconductor or the like, the cured product obtained by curing the present composition preferably has a type-D durometer hardness of 60 or more or 70 or more at 25° C. This type-D durometer hardness is determined by the type-D durometer in accordance with the JIS K 6253-1997 "Hardness Testing Methods for Vulcanized Rubber and Thermoplastic Rubber".

Furthermore, since it is suitable as a sealant for semiconductors which is required to have high hardness and high strength, the bending strength of the cured product measured by the method specified in JIS K 6911-1995 "Testing Methods for Thermosetting Plastics" is preferably 15 MPa or more, or 20 MPa or more.

[Use of Composition]

Since the present composition has hot melt properties and excellent handling workability and curability at the time of melting (hot melting), it is suitable as a sealant for semiconductors; a sealant for power semiconductors such as SiC and GaN; or as an adhesive, a potting agent, a protective agent, or a coating agent for electricity and electronics. Since the composition has hot-melt properties, it is also suitable as a material for transfer molding, compression molding, or injection molding. In particular, it is preferable to use the composition as a sealant for semiconductors using an overmold molding method at the time of molding.

[Use of Cured Product]

The application of the cured product of the present invention is not particularly limited, but the composition of the present invention has hot-melt properties, is excellent in moldability and mechanical properties, and the cured product exhibits characteristic behavior of an average linear expansion coefficient and a storage modulus at room temperature to high temperature as described above. Therefore, the cured product obtained by curing the present composition can be suitably used as a member for a semiconductor device, and can be suitably used as a sealant for a semiconductor element, an IC chip or the like, and as an adhesive/bonding member of a conductor device.

There is no particular restriction on a semiconductor device having a member made of the cured product of the present invention, but it is particularly preferable to be a power semiconductor device. As described above, since the cured product obtained by curing the composition of the present invention exhibits characteristic behavior of an average linear expansion coefficient and a storage modulus, it is difficult to cause defects of the cured product against molding and temperature shock, and it is possible to protect the semiconductor element and the circuit board, suppress deterioration thereof, and realize a long life.

EXAMPLES

The curable particulate silicone composition of the present invention, the production method thereof, and an inorganic filler treatment method will be described in further detail hereinafter using examples and comparative examples. Note that in the formulas, Me, Ph, and Vi represent a methyl group, a phenyl group, and a vinyl group, respectively. In addition, for the curable particulate silicone compositions of each of the examples and comparative examples, the softening point, melt viscosity, moldability, and bending strength of the cured product, average linear expansion coefficient, and linear expansion coefficient curve of the cured product were measured as follows, and the results are shown in Tables 1 and 2 and in FIG. 1.

[Softening Point of Curable Particulate Silicone Composition]

The curable particulate silicone composition was molded into cylindrical pellets of $14 mm*22 mm. The pellet was placed on a hot plate set at 25° C. to 100° C. and kept pressed from above for 10 seconds with a load of 100 grams, and after the load was removed, the amount of deformation of the pellet was measured. The temperature at which the deformation amount in the height direction was 1 mm or more was defined as the softening point.

[Melt Viscosity]

The melt viscosity of the curable particulate silicone used as a raw material of the composition was measured at 150° C. at a shear rate of 5 (1/s) using an AR2000EX rheometer (manufactured by T.A. Instruments Japan K.K.) as a rotational viscometer.

The melt viscosity of the curable particulate silicone composition at 180° C. was measured using a nozzle having a diameter of 0.5 mm under 100 kgf of pressure with a CFT-500EX Koka-type flow tester (manufactured by the Shimadzu Corporation). Note that when the composition did not soften and the melt viscosity at 180° C. could not be measured, the result was evaluated as "N/A".

[Moldability]

The curable particulate silicone composition was integrally molded with a lead frame made of copper using a transfer molding machine to produce a molded product having a length of 35 mm, a width of 25 mm, a height of 1 mm. As molding conditions, the mold temperature was set to 180° C. and the mold-closed time was set to 120 seconds. After the molded product was removed from the mold, it was cooled to 25° C., and the degree of filling of the material, the presence or absence of cracks and the presence or absence of molding defects such as peeling from the lead frame were visually confirmed.

Cases in which the flowability of the material was poor so that the material did not cover the entire mold space during molding were evaluated as "unfilled", and cracks, peeling, or the like after molding were evaluated as "cracks present" or "peeling present".

[Average Linear Expansion Coefficient of Cured Product]

The curable silicone composition was heated at 180° C. for 2 hours to prepare a cured product. The average linear expansion coefficient of the cured product in the range of 25° C. to 200° C. was measured by the method prescribed in JIS K 7197-1991 "Testing method for linear thermal expansion coefficient of plastics by thermomechanical analysis".

[Bending Strength of Cured Product]

The curable silicone composition was heated at 180° C. for 2 hours to prepare a cured product. The bending strength of the cured product was measured by the method prescribed in JIS K 6911-1995 "General Testing Method for Thermosetting Plastics".

[Linear Expansion Coefficient Curve of Cured Product]

The curable silicone composition of Example 1 was cured by the method described above to prepare a cured product. The linear expansion coefficient of the cured product was measured with a TM9200 manufactured by Advance Riko, Inc. in a temperature range of 20° C. to 300° C. The results are as shown in FIG. 1, and any definite inflection points were not observed. (The x axis is temperature and the y axis is change in size.)

Note that in the other examples, definite inflection points were not observed in the temperature range of 20° C. to 200° C. when the linear expansion coefficient curve of the cured product was drawn.

Reference Example 1

A toluene solution of a resinous organopolysiloxane (1) containing 10 ppm of platinum metal in mass units was prepared by charging 270.5 g of a 55 mass % toluene solution of a resinous organopolysiloxane represented by the average unit formula:

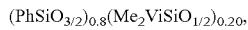

(PhSiO$_{3/2}$)$_{0.8}$(Me$_2$ViSiO$_{1/2}$)$_{0.20}$, which is a white solid at 25° C., and 0.034 g of a 1,3-divinyltetramethyldisiloxane solution of platinum 1,3-divinyltetramethyldisiloxane complex (platinum metal content=approximately 4000 ppm) into a 1 L flask and stirring uniformly at room temperature (25° C.). In addition, the softening point of this resinous organopolysiloxane (1) was 100° C., and the melt viscosity thereof at 100° C. was 100 Pa·s.

Reference Example 2

A toluene solution of a resinous organopolysiloxane (1) containing 10 ppm of platinum metal in mass units was prepared by charging 270.5 g of a 55 mass % toluene solution of a resinous organopolysiloxane represented by the average unit formula:

(PhSiO$_{3/2}$)$_{0.80}$(Me$_2$ViSiO$_{1/2}$)$_{0.20}$, which is a white solid at 25° C., 21.3 g of a diphenylsiloxane capped at both molecular terminals with dimethylhydrogensiloxy groups and having a viscosity of 5 mPa·s (silicon-bonded hydrogen atom content=0.6 mass %) represented by the formula:

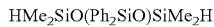

HMe$_2$SiO(Ph$_2$SiO)SiMe$_2$H (in an amount such that the amount of silicon-bonded hydrogen atoms in this component is 0.5 mol relative to 1 mol of vinyl groups in the resinous organopolysiloxane), and 0.034 g of a 1,3-divinyltetramethyldisiloxane solution of platinum 1,3-divinyltetramethyldisiloxane complex (platinum metal content=approximately 4000 ppm) (in an amount such that the amount of platinum metal is 10 ppm in mass units with respect to this liquid mixture) into a 1 L flask and stirring uniformly at room temperature. Thereafter, the temperature in the flask was raised to 100° C. by an oil bath, and the mixture was stirred under a reflux of toluene for 2 hours to prepare a toluene solution of an organosiloxane crosslinked product (2) containing a resinous organosiloxane derived from the above-mentioned resinous organopolysiloxane and a chained organosiloxane derived from the above-mentioned diphenylsiloxane and having a vinyl group not involved in the above-mentioned reaction. When the organosiloxane crosslinked product (2) was analyzed by FT-IR, peaks of silicon atom bonded hydrogen atom were not observed. In addition, the softening point of this organosiloxane crosslinked product (2) was 75° C., and the melt viscosity thereof at 100° C. was 700 Pa·s.

Reference Example 3

True-spherical hot-melt silicone fine particles (1) were prepared by atomizing the toluene solution of the resinous organopolysiloxane (1) prepared in Reference Example 1 by spray drying at 40° C. while removing toluene. Observation of the fine particles with an optical microscope revealed that the particle diameter was 5 to 10 μm and the average particle diameter was 7.9 μm.

Reference Example 4

True-spherical hot-melt silicone fine particles (2) were prepared by atomizing the toluene solution of the organosiloxane crosslinked product (2) prepared in Reference Example 2 by spray drying at 40° C. while removing toluene. Observation of the fine particles with an optical microscope revealed that the particle diameter was 5 to 10 μm and the average particle diameter was 7.5 μm.

Example 1

First, 1900.0 g of fused silica having an average particle diameter of 17 μm (S6050P manufactured by Nippon Steel Materials, Inc.) and 9.5 g of dimethylpolysiloxane having a viscosity of 23 mPa·s and represented by the formula:

Me$_2$ViSiO(Me$_2$SiO)$_{29}$Si(OMe)$_3$ were charged as a single batch into a small pulverizer and stirred 5 times for 1 minute at 150° C., and after the fused silica was surface-treated, the temperature of the pulverizer was returned to 25° C.

Next, 78.7 g of hot meltable silicone fine particles (1), 9.1 g of diphenylsiloxane capped at both molecular terminals with dimethylhydrogensiloxy groups and having a viscosity of 5 mPa·s (silicon-bonded hydrogen atom content=0.6 mass %) represented by the formula:

HMe$_2$SiO(Ph$_2$SiO)SiMe$_2$H, 12.2 g of a branched-chain organopolysiloxane having two or more silicon-bonded hydrogen atoms in each molecule and having a viscosity of 25 mPa·s (silicon-bonded hydrogen atom content=0.65 mass %) represented by the average unit formula:

(PhSiO$_{3/2}$)$_{0.4}$(HMe$_2$SiO$_{1/2}$)$_{0.6}$.

{in an amount such that the amount of silicon-bonded hydrogen atoms in the diphenylsiloxane and the organopolysiloxane is 1.0 mol relative to 1 mol of vinyl groups in the silicone fine particles (1)}, and 1-ethynyl-1-cyclohexanol (in an amount of 300 ppm in mass units relative to the present composition) were additionally charged into the small pulverizer and stirred for 1 minute at room temperature (25° C.) to prepare a uniform white curable particulate silicone composition. Next, this composition was tableted by a tableting machine to prepare cylindrical pellets having a diameter of 14 mm and a height of 22 mm.

The average linear expansion coefficient curve of the cured product at 25° C. to 250° C. is as shown in FIG. 1, and as in the other examples, no definite inflection points were observed.

Example 2

First, 1900.0 g of fused silica having an average particle diameter of 17 μm (S6050P manufactured by Nippon Steel Materials, Inc.) and 14.5 g of dimethylpolysiloxane having a viscosity of 23 mPa·s and represented by the formula:

Me$_2$ViSiO(Me$_2$SiO)$_{29}$Si(OMe)$_3$ were charged as a single batch into a small pulverizer and stirred 5 times for 1 minute at 150° C., and after the fused silica was surface-treated, the temperature of the pulverizer was returned to 25° C.

Next, 78.7 g of hot meltable silicone fine particles (1), 9.1 g of diphenylsiloxane capped at both molecular terminals with dimethylhydrogensiloxy groups and having a viscosity of 5 mPa·s (silicon-bonded hydrogen atom content=0.6 mass %) represented by the formula:

HMe$_2$SiO(Ph$_2$SiO)SiMe$_2$H, 12.2 g of a branched-chain organopolysiloxane having two or more silicon-bonded hydrogen atoms in each molecule and having a viscosity of 25 mPa·s (silicon-bonded hydrogen atom content=0.65 mass %) represented by the average unit formula:

(PhSiO$_{3/2}$)$_{0.4}$(HMe$_2$SiO$_{1/2}$)$_{0.6}$,

{in an amount such that the amount of silicon-bonded hydrogen atoms in the diphenylsiloxane and the organopolysiloxane is 1.0 mol relative to 1 mol of vinyl groups in the silicone fine particles (1)}, and 1-ethynyl-1-cyclohexanol (in an amount of 300 ppm in mass units relative to the present composition) were additionally charged into the small pulverizer and stirred for 1 minute at room temperature (25° C.) to prepare a uniform white curable particulate silicone composition. Next, this composition was tableted by a tableting machine to prepare cylindrical pellets having a diameter of 14 mm and a height of 22 mm.

Example 3

First, 1900.0 g of fused silica having an average particle diameter of 17 μm (S6050P manufactured by Nippon Steel Materials, Inc.) and 19 g of dimethylpolysiloxane having a viscosity of 23 mPa·s and represented by the formula:

Me$_2$ViSiO(Me$_2$SiO)$_{29}$Si(OMe)$_3$ were charged as a single batch into a small pulverizer and stirred 5 times for 1 minute at 150° C., and after the fused silica was surface-treated, the temperature of the pulverizer was returned to 25° C.

Next, 78.7 g of hot meltable silicone fine particles (1), 9.1 g of diphenylsiloxane capped at both molecular terminals with dimethylhydrogensiloxy groups and having a viscosity of 5 mPa·s (silicon-bonded hydrogen atom content=0.6 mass %) represented by the formula:

HMe$_2$SiO(Ph$_2$SiO)SiMe$_2$H, 12.2 g of a branched-chain organopolysiloxane having two or more silicon-bonded hydrogen atoms in each molecule and having a viscosity of 25 mPa·s (silicon-bonded hydrogen atom content=0.65 mass %) represented by the average unit formula:

(PhSiO$_{3/2}$)$_{0.4}$(HMe$_2$SiO$_{1/2}$)$_{0.6}$,

{in an amount such that the amount of silicon-bonded hydrogen atoms in the diphenylsiloxane and the organopolysiloxane is 1.0 mol relative to 1 mol of vinyl groups in the silicone fine particles (1)}, and 1-ethynyl-1-cyclohexanol (in an amount of 300 ppm in mass units relative to the present composition) were additionally charged into the small pulverizer and stirred for 1 minute at room temperature (25° C.) to prepare a uniform white curable particulate silicone composition. Next, this composition was tableted by a tableting machine to prepare cylindrical pellets having a diameter of 14 mm and a height of 22 mm.

Example 4

First, 1450.0 g of fused silica having an average particle diameter of 15 μm (S610-5P manufactured by Nippon Steel Materials, Inc.) and 7.0 g of dimethylpolysiloxane having a viscosity of 23 mPa·s and represented by the formula:

Me$_2$ViSiO(Me$_2$SiO)$_{29}$Si(OMe)$_3$ were charged as a single batch into a small pulverizer and stirred 5 times for 1 minute at 150° C., and after the fused silica was surface-treated, the temperature of the pulverizer was returned to 25° C.

Next, 78.7 g of hot meltable silicone fine particles (1), 9.1 g of diphenylsiloxane capped at both molecular terminals with dimethylhydrogensiloxy groups and having a viscosity of 5 mPa·s (silicon-bonded hydrogen atom content=0.6 mass %) represented by the formula:

$HMe_2SiO(Ph_2SiO)SiMe_2H$, 12.2 g of a branched-chain organopolysiloxane having two or more silicon-bonded hydrogen atoms in each molecule and having a viscosity of 25 mPa·s (silicon-bonded hydrogen atom content=0.65 mass %) represented by the average unit formula:

$(PhSiO_{3/2})_{0.4}(HMe_2SiO_{1/2})_{0.6}$,

{in an amount such that the amount of silicon-bonded hydrogen atoms in the diphenylsiloxane and the organopolysiloxane is 1.0 mol relative to 1 mol of vinyl groups in the silicone fine particles (1)}, and 1-ethynyl-1-cyclohexanol (in an amount of 300 ppm in mass units relative to the present composition) were additionally charged into the small pulverizer and stirred for 1 minute at room temperature (25° C.) to prepare a uniform white curable particulate silicone composition. Next, this composition was tableted by a tableting machine to prepare cylindrical pellets having a diameter of 14 mm and a height of 22 mm.

Example 5

First, 1900.0 g of fused silica having an average particle diameter of 17 μm (S6050P manufactured by Nippon Steel Materials, Inc.) and 9.5 g of dimethylpolysiloxane having a viscosity of 125 mPa·s and represented by the formula:

$Me_3SiO(Me_2SiO)_{110}Si(OMe)_3$ were charged as a single batch into a small pulverizer and stirred 5 times for 1 minute at 150° C., and after the fused silica was surface-treated, the temperature of the pulverizer was returned to 25° C.

Next, 78.7 g of hot meltable silicone fine particles (1), 9.1 g of diphenylsiloxane capped at both molecular terminals with dimethylhydrogensiloxy groups and having a viscosity of 5 mPa·s (silicon-bonded hydrogen atom content=0.6 mass %) represented by the formula:

$HMe_2SiO(Ph_2SiO)SiMe_2H$, 12.2 g of a branched-chain organopolysiloxane having two or more silicon-bonded hydrogen atoms in each molecule and having a viscosity of 25 mPa·s (silicon-bonded hydrogen atom content=0.65 mass %) represented by the average unit formula:

$(PhSiO_{3/2})_{0.4}(HMe_2SiO_{1/2})_{0.6}$,

{in an amount such that the amount of silicon-bonded hydrogen atoms in the diphenylsiloxane and the organopolysiloxane is 1.0 mol relative to 1 mol of vinyl groups in the silicone fine particles (1)}, and 1-ethynyl-1-cyclohexanol (in an amount of 300 ppm in mass units relative to the present composition) were additionally charged into the small pulverizer and stirred for 1 minute at room temperature (25° C.) to prepare a uniform white curable particulate silicone composition. Next, this composition was tableted by a tableting machine to prepare cylindrical pellets having a diameter of 14 mm and a height of 22 mm.

Example 6

First, 1900.0 g of fused silica having an average particle diameter of 17 μm (S6050P manufactured by Nippon Steel Materials, Inc.) and 14.5 g of dimethylpolysiloxane having a viscosity of 125 mPa·s and represented by the formula:

$Me_3SiO(Me_2SiO)_{110}Si(OMe)_3$ were charged as a single batch into a small pulverizer and stirred 5 times for 1 minute at 150° C., and after the fused silica was surface-treated, the temperature of the pulverizer was returned to 25° C.

Next, 78.7 g of hot meltable silicone fine particles (1), 9.1 g of diphenylsiloxane capped at both molecular terminals with dimethylhydrogensiloxy groups and having a viscosity of 5 mPa·s (silicon-bonded hydrogen atom content=0.6 mass %) represented by the formula:

$HMe_2SiO(Ph_2SiO)SiMe_2H$, 12.2 g of a branched-chain organopolysiloxane having two or more silicon-bonded hydrogen atoms in each molecule and having a viscosity of 25 mPa·s (silicon-bonded hydrogen atom content=0.65 mass %) represented by the average unit formula:

$(PhSiO_{3/2})_{0.4}(HMe_2SiO_{1/2})_{0.6}$,

{in an amount such that the amount of silicon-bonded hydrogen atoms in the diphenylsiloxane and the organopolysiloxane is 1.0 mol relative to 1 mol of vinyl groups in the silicone fine particles (1)}, and 1-ethynyl-1-cyclohexanol (in an amount of 300 ppm in mass units relative to the present composition) were additionally charged into the small pulverizer and stirred for 1 minute at room temperature (25° C.) to prepare a uniform white curable particulate silicone composition. Next, this composition was tableted by a tableting machine to prepare cylindrical pellets having a diameter of 14 mm and a height of 22 mm.

Example 7

First, 1900.0 g of fused silica having an average particle diameter of 17 μm (S6050P manufactured by Nippon Steel Materials, Inc.), 4.5 g of dimethylpolysiloxane having a viscosity of 125 mPa·s and represented by the formula:

$Me_3SiO(Me_2SiO)_{110}Si(OMe)_3$, and 5.0 g of dimethylpolysiloxane having a viscosity of 23 mPa·s and represented by the formula:

$Me_2ViSiO(Me_2SiO)_{29}Si(OMe)_3$ were charged as a single batch into a small pulverizer and stirred 5 times for 1 minute at 150° C., and after the fused silica was surface-treated, the temperature of the pulverizer was returned to 25° C.

Next, 78.7 g of hot meltable silicone fine particles (1), 9.1 g of diphenylsiloxane capped at both molecular terminals with dimethylhydrogensiloxy groups and having a viscosity of 5 mPa·s (silicon-bonded hydrogen atom content=0.6 mass %) represented by the formula:

$HMe_2SiO(Ph_2SiO)SiMe_2H$, 12.2 g of a branched-chain organopolysiloxane having two or more silicon-bonded hydrogen atoms in each molecule and having a viscosity of 25 mPa·s (silicon-bonded hydrogen atom content=0.65 mass %) represented by the average unit formula:

$(PhSiO_{3/2})_{0.4}(HMe_2SiO_{1/2})_{0.6}$,

{in an amount such that the amount of silicon-bonded hydrogen atoms in the diphenylsiloxane and the organopolysiloxane is 1.0 mol relative to 1 mol of vinyl groups in the silicone fine particles (1)}, and 1-ethynyl-1-cyclohexanol (in an amount of 300 ppm in mass units relative to the present composition) were additionally charged into the small pulverizer and stirred for 1 minute at room temperature (25° C.) to prepare a uniform white curable particulate silicone composition. Next, this composition was tableted by a tableting machine to prepare cylindrical pellets having a diameter of 14 mm and a height of 22 mm.

Example 8

First, 1900.0 g of fused silica having an average particle diameter of 17 μm (S6050P manufactured by Nippon Steel Materials, Inc.) and 9.5 g of dimethylpolysiloxane having a viscosity of 23 mPa·s and represented by the formula:

$Me_2ViSiO(Me_2SiO)_{29}Si(OMe)_3$ were charged as a single batch into a small pulverizer and stirred 5 times for 1 minute at 150° C., and after the fused silica was surface-treated, the temperature of the pulverizer was returned to 25° C.

Next, 80.0 g of hot meltable silicone fine particles (1), 10.0 g of diphenylsiloxane capped at both molecular terminals with dimethylvinylsiloxy groups and having a viscosity of 1,000 mPa·s (vinyl group content=2.1 mass %) represented by the average formula $Me_2ViSiO(MePhSiO)_{17.5}SiMe_2Vi$, 10.0 g of organopolysiloxane having a viscosity of 4 mPa·s represented by the average molecular formula:

$(MeViSiO_{2/2})_4$, and 8.0 g of 2,5-Dimethyl-2,5-di(tert-butylperoxy)hexane (10-hour half-life temperature: 118° C.) were additionally charged into the small pulverizer and stirred for 1 minute at room temperature (25° C.) to prepare a uniform white curable particulate silicone composition. Next, this composition was tableted by a tableting machine to prepare cylindrical pellets having a diameter of 14 mm and a height of 22 mm.

Example 9

First, 1900.0 g of fused silica having an average particle diameter of 17 μm (S6050P manufactured by Nippon Steel Materials, Inc.), 4.5 g of dimethylpolysiloxane having a viscosity of 125 mPa·s and represented by the formula:

$Me_3SiO(Me_2SiO)_{110}Si(OMe)_3$, and 5.0 g of dimethylpolysiloxane having a viscosity of 23 mPa·s and represented by the formula:

$Me_2ViSiO(Me_2SiO)_{29}Si(OMe)_3$ were charged as a single batch into a small pulverizer and stirred 5 times for 1 minute at 150° C., and after the fused silica was surface-treated, the temperature of the pulverizer was returned to 25° C.

Next, 80.0 g of hot meltable silicone fine particles (1), 10.0 g of diphenylsiloxane capped at both molecular terminals with dimethylvinylsiloxy groups and having a viscosity of 1,000 mPa·s (vinyl group content=2.1 mass %) represented by the average formula $Me_2ViSiO(MePhSiO)_{17.5}SiMe_2Vi$, 10.0 g of organopolysiloxane having a viscosity of 4 mPa·s represented by the average molecular formula:

$(MeViSiO_{2/2})_4$, and 8.0 g of 2,5-Dimethyl-2,5-di(tert-butylperoxy)hexane (10-hour half-life temperature: 118° C.) were additionally charged into the small pulverizer and stirred for 1 minute at room temperature (25° C.) to prepare a uniform white curable particulate silicone composition. Next, this composition was tableted by a tableting machine to prepare cylindrical pellets having a diameter of 14 mm and a height of 22 mm.

Example 10

First, 1900.0 g of fused silica having an average particle diameter of 17 μm (S6050P manufactured by Nippon Steel Materials, Inc.) and 9.5 g of dimethylpolysiloxane having a viscosity of 23 mPa·s and represented by the formula:

$Me_2ViSiO(Me_2SiO)_{29}Si(OMe)_3$ were charged as a single batch into a small pulverizer and stirred 5 times for 1 minute at 150° C., and after the fused silica was surface-treated, the temperature of the pulverizer was returned to 25° C.

Next, 74.1 g of hot meltable silicone fine particles (2), 11.1 g of diphenylsiloxane capped at both molecular terminals with dimethylhydrogensiloxy groups and having a viscosity of 5 mPa·s (silicon-bonded hydrogen atom content=0.6 mass %) represented by the formula:

$HMe_2SiO(Ph_2SiO)SiMe_2H$, and 14.8 g of a methylphenylpolysiloxane capped at both molecular terminals with dimethylvinylsiloxy groups and having a viscosity of 1,000 Pa·s (vinyl group content=2.1 mass %) represented by the average formula $Me_2ViSiO(MePhSiO)_{17.5}SiMe_2Vi$ {in an amount such that the amount of silicon-bonded hydrogen atoms in the diphenylsiloxane is 1.0 mol relative to 1 mol of vinyl groups in the silicone fine particles (2) and the methylphenylpolysiloxane capped at both molecular terminals with dimethylvinylsiloxy groups} were additionally charged into the small pulverizer and stirred for 1 minute at room temperature (25° C.) to prepare a uniform white curable particulate silicone composition. Next, this composition was tableted by a tableting machine to prepare cylindrical pellets having a diameter of 14 mm and a height of 22 mm.

Example 11

First, 2100.0 g of spherical alumina (having an average particle diameter of 35 μm (AZ35-125 manufactured by Nippon Steel Materials, Inc.), 900.0 g of spherical alumina having an average particle diameter of 2.5 μm (AZ2-75 manufactured by Nippon Steel Materials, Inc.), and 15.0 g of dimethylpolysiloxane having a viscosity of 23 mPa·s and represented by the formula:

$Me_2ViSiO(Me_2SiO)_{29}Si(OMe)_3$ were charged as a single batch into a small pulverizer and stirred 5 times for 1 minute at 150° C., and after the fused silica was surface-treated, the temperature of the pulverizer was returned to 25° C.

Next, 78.7 g of hot meltable silicone fine particles (1), 9.1 g of diphenylsiloxane capped at both molecular terminals with dimethylhydrogensiloxy groups and having a viscosity of 5 mPa·s (silicon-bonded hydrogen atom content=0.6 mass %) represented by the formula:

$HMe_2SiO(Ph_2SiO)SiMe_2H$, 12.2 g of a branched-chain organopolysiloxane having two or more silicon-bonded hydrogen atoms in each molecule and having a viscosity of 25 mPa·s (silicon-bonded hydrogen atom content=0.65 mass %) represented by the average unit formula:

(PhSiO$_{3/2}$)$_{0.4}$(HMe$_2$SiO$_{1/2}$)$_{0.6}$,

{in an amount such that the amount of silicon-bonded hydrogen atoms in the diphenylsiloxane and the organopolysiloxane is 1.0 mol relative to 1 mol of vinyl groups in the silicone fine particles (1)}, and 1-ethynyl-1-cyclohexanol (in an amount of 300 ppm in mass units relative to the present composition) were additionally charged into the small pulverizer and stirred for 1 minute at room temperature (25° C.) to prepare a uniform white curable particulate silicone composition. Next, this composition was tableted by a tableting machine to prepare cylindrical pellets having a diameter of 14 mm and a height of 22 mm.

Comparative Example 1

First, 78.7 g of hot meltable silicone fine particles (1), 9.1 g of diphenylsiloxane capped at both molecular terminals with dimethylhydrogensiloxy groups and having a viscosity of 5 mPa·s (silicon-bonded hydrogen atom content=0.6 mass %) represented by the formula:

HMe$_2$SiO(Ph$_2$SiO)SiMe$_2$H, 12.2 g of a branched-chain organopolysiloxane having two or more silicon-bonded hydrogen atoms in each molecule and having a viscosity of 25 mPa·s (silicon-bonded hydrogen atom content=0.65 mass %) represented by the average unit formula:

(PhSiO$_{3/2}$)$_{0.4}$(HMe$_2$SiO$_{1/2}$)$_{0.6}$,

{in an amount such that the amount of silicon-bonded hydrogen atoms in the diphenylsiloxane and the organopolysiloxane is 1.0 mol relative to 1 mol of vinyl groups in the silicone fine particles (1)}, and 1181.1 g of fused silica having an average particle diameter of 15 μm (HS-202 manufactured by Nippon Steel Materials, Inc.) were charged as a single batch into a small pulverizer and stirred for 1 minute at room temperature (25° C.) to prepare a uniform white curable particulate silicone composition. Next, this composition was tableted by a tableting machine to prepare cylindrical pellets having a diameter of 14 mm and a height of 22 mm.

Comparative Example 2

First, 78.7 g of hot meltable silicone fine particles (1), 9.1 g of diphenylsiloxane capped at both molecular terminals with dimethylhydrogensiloxy groups and having a viscosity of 5 mPa·s (silicon-bonded hydrogen atom content=0.6 mass %) represented by the formula:

HMe$_2$SiO(Ph$_2$SiO)SiMe$_2$H, 12.2 g of a branched-chain organopolysiloxane having two or more silicon-bonded hydrogen atoms in each molecule and having a viscosity of 25 mPa·s (silicon-bonded hydrogen atom content=0.65 mass %) represented by the average unit formula:

(PhSiO$_{3/2}$)$_{0.4}$(HMe$_2$SiO$_{1/2}$)$_{0.6}$,

{in an amount such that the amount of silicon-bonded hydrogen atoms in the diphenylsiloxane and the organopolysiloxane is 1.0 mol relative to 1 mol of vinyl groups in the silicone fine particles (1)}, and 1900.0 g of fused silica having an average particle diameter of 17 μm (S6050P manufactured by Nippon Steel Materials, Inc.) were charged as a single batch into a small pulverizer and stirred for 1 minute at room temperature (25° C.) to prepare a uniform white curable particulate silicone composition. Next, this composition was tableted by a tableting machine to prepare cylindrical pellets having a diameter of 14 mm and a height of 22 mm.

Comparative Example 3

First, 1650.0 g of fused silica having an average particle diameter of 17 μm (S6050P manufactured by Nippon Steel Materials, Inc.) and 1.0 g of dimethylpolysiloxane having a viscosity of 23 mPa·s and represented by the formula:

Me$_2$ViSiO(Me$_2$SiO)$_{29}$Si(OMe)$_3$ were charged as a single batch into a small pulverizer and stirred 5 times for 1 minute at 150° C., and after the fused silica was surface-treated, the temperature of the pulverizer was returned to 25° C.

Next, 78.7 g of hot meltable silicone fine particles (1), 9.1 g of diphenylsiloxane capped at both molecular terminals with dimethylhydrogensiloxy groups and having a viscosity of 5 mPa·s (silicon-bonded hydrogen atom content=0.6 mass %) represented by the formula:

HMe$_2$SiO(Ph$_2$SiO)SiMe$_2$H, 12.2 g of a branched-chain organopolysiloxane having two or more silicon-bonded hydrogen atoms in each molecule and having a viscosity of 25 mPa·s (silicon-bonded hydrogen atom content=0.65 mass %) represented by the average unit formula:

(PhSiO$_{3/2}$)$_{0.4}$(HMe$_2$SiO$_{1/2}$)$_{0.6}$,

{in an amount such that the amount of silicon-bonded hydrogen atoms in the diphenylsiloxane and the organopolysiloxane is 1.0 mol relative to 1 mol of vinyl groups in the silicone fine particles (1)}, and 1-ethynyl-1-cyclohexanol (in an amount of 300 ppm in mass units relative to the present composition) were additionally charged into the small pulverizer and stirred for 1 minute at room temperature (25° C.) to prepare a uniform white curable particulate silicone composition. Next, this composition was tableted by a tableting machine to prepare cylindrical pellets having a diameter of 14 mm and a height of 22 mm.

Comparative Example 4

First, 4500.0 g of fused silica having an average particle diameter of 17 μm (S6050P manufactured by Nippon Steel Materials, Inc.) and 19.0 g of dimethylpolysiloxane having a viscosity of 23 mPa·s and represented by the formula:

Me$_2$ViSiO(Me$_2$SiO)$_{29}$Si(OMe)$_3$ were charged as a single batch into a small pulverizer and stirred 5 times for 1 minute at 150° C., and after the fused silica was surface-treated, the temperature of the pulverizer was returned to 25° C.

Next, 78.7 g of hot meltable silicone fine particles (1), 9.1 g of diphenylsiloxane capped at both molecular terminals with dimethylhydrogensiloxy groups and having a viscosity of 5 mPa·s (silicon-bonded hydrogen atom content=0.6 mass %) represented by the formula:

HMe$_2$SiO(Ph$_2$SiO)SiMe$_2$H, 12.2 g of a branched-chain organopolysiloxane having two or more silicon-bonded hydrogen atoms in each molecule and having a viscosity of 25 mPa·s (silicon-bonded hydrogen atom content=0.65 mass %) represented by the average unit formula:

(PhSiO$_{3/2}$)$_{0.4}$(HMe$_2$SiO$_{1/2}$)$_{0.6}$,

{in an amount such that the amount of silicon-bonded hydrogen atoms in the diphenylsiloxane and the organopolysiloxane is 1.0 mol relative to 1 mol of vinyl groups in the silicone fine particles (1)}, and 1-ethynyl-1-cyclohexanol (in an amount of 300 ppm in mass units relative to the present composition) were additionally charged into the small pulverizer and stirred for 1 minute at room temperature (25° C.) to prepare a uniform white curable particulate silicone composition. Next, this composition was tableted by a tableting machine to prepare cylindrical pellets having a diameter of 14 mm and a height of 22 mm.

Comparative Example 5

First, 1900.0 g of fused silica having an average particle diameter of 17 μm (S6050P manufactured by Nippon Steel Materials, Inc.) and 9.5 g of n-octyltriethoxysilane were charged as a single batch into a small pulverizer and stirred 5 times for 1 minute at 150° C., and after the fused silica was surface-treated, the temperature of the pulverizer was returned to 25° C.

Next, 78.7 g of hot meltable silicone fine particles (1), 9.1 g of diphenylsiloxane capped at both molecular terminals with dimethylhydrogensiloxy groups and having a viscosity of 5 mPa·s (silicon-bonded hydrogen atom content=0.6 mass %) represented by the formula:

HMe$_2$SiO(Ph$_2$SiO)SiMe$_2$H, 12.2 g of a branched-chain organopolysiloxane having two or more silicon-bonded hydrogen atoms in each molecule and having a viscosity of 25 mPa·s (silicon-bonded hydrogen atom content=0.65 mass %) represented by the average unit formula:

(PhSiO$_{3/2}$)$_{0.4}$(HMe$_2$SiO$_{1/2}$)$_{0.6}$,

{in an amount such that the amount of silicon-bonded hydrogen atoms in the diphenylsiloxane and the organopolysiloxane is 1.0 mol relative to 1 mol of vinyl groups in the silicone fine particles (1)}, and 1-ethynyl-1-cyclohexanol (in an amount of 300 ppm in mass units relative to the present composition) were additionally charged into the small pulverizer and stirred for 1 minute at room temperature (25° C.) to prepare a uniform white curable particulate silicone composition. Next, this composition was tableted by a tableting machine to prepare cylindrical pellets having a diameter of 14 mm and a height of 22 mm.

Comparative Example 6

First, 1900.0 g of fused silica having an average particle diameter of 17 μm (S6050P manufactured by Nippon Steel Materials, Inc.) and 19.0 g of n-octyltriethoxysilane were charged as a single batch into a small pulverizer and stirred 5 times for 1 minute at 150° C., and after the fused silica was surface-treated, the temperature of the pulverizer was returned to 25° C.

Next, 78.7 g of hot meltable silicone fine particles (1), 9.1 g of diphenylsiloxane capped at both molecular terminals with dimethylhydrogensiloxy groups and having a viscosity of 5 mPa·s (silicon-bonded hydrogen atom content=0.6 mass %) represented by the formula:

HMe$_2$SiO(Ph$_2$SiO)SiMe$_2$H, 12.2 g of a branched-chain organopolysiloxane having two or more silicon-bonded hydrogen atoms in each molecule and having a viscosity of 25 mPa·s (silicon-bonded hydrogen atom content=0.65 mass %) represented by the average unit formula:

(PhSiO$_{3/2}$)$_{0.4}$(HMe$_2$SiO$_{1/2}$)$_{0.6}$,

{in an amount such that the amount of silicon-bonded hydrogen atoms in the diphenylsiloxane and the organopolysiloxane is 1.0 mol relative to 1 mol of vinyl groups in the silicone fine particles (1)}, and 1-ethynyl-1-cyclohexanol (in an amount of 300 ppm in mass units relative to the present composition) were additionally charged into the small pulverizer and stirred for 1 minute at room temperature (25° C.) to prepare a uniform white curable particulate silicone composition. Next, this composition was tableted by a tableting machine to prepare cylindrical pellets having a diameter of 14 mm and a height of 22 mm.

Comparative Example 7

First, 1900.0 g of fused silica having an average particle diameter of 17 μm (S6050P manufactured by Nippon Steel Materials, Inc.) and 19.0 g of methyltrimethoxysilane were charged as a single batch into a small pulverizer and stirred 5 times for 1 minute at 150° C., and after the fused silica was surface-treated, the temperature of the pulverizer was returned to 25° C.

Next, 80.0 g of hot meltable silicone fine particles (1), 10.0 g of diphenylsiloxane capped at both molecular terminals with dimethylvinylsiloxy groups and having a viscosity of 1,000 mPa·s (vinyl group content=2.1 mass %) represented by the average formula Me$_2$ViSiO(MePhSiO)$_{17.5}$SiMe$_2$Vi, 10.0 g of organopolysiloxane having a viscosity of 4 mPa·s represented by the average molecular formula:

(MeViSiO$_{2/2}$)$_4$,

And 8.0 g of 2,5-Dimethyl-2,5-di(tert-butylperoxy)hexane (10-hour half-life temperature: 118° C.) were additionally charged into the small pulverizer and stirred for 1 minute at room temperature (25° C.) to prepare a uniform white curable particulate silicone composition. Next, this composition was tableted by a tableting machine to prepare cylindrical pellets having a diameter of 14 mm and a height of 22 mm.

Comparative Example 8

First, 1900.0 g of fused silica having an average particle diameter of 17 μm (S6050P manufactured by Nippon Steel Materials, Inc.) and 19.0 g of phenyltrimethoxysilane were charged as a single batch into a small pulverizer and stirred 5 times for 1 minute at 150° C., and after the fused silica was surface-treated, the temperature of the pulverizer was returned to 25° C.

Next, 74.1 g of hot meltable silicone fine particles (2), 11.1 g of diphenylsiloxane capped at both molecular terminals with dimethylhydrogensiloxy groups and having a viscosity of 5 mPa·s (silicon-bonded hydrogen atom content=0.6 mass %) represented by the formula:

HMe$_2$SiO(Ph$_2$SiO)SiMe$_2$H, and 14.8 g of a methylphenylpolysiloxane capped at both molecular terminals with dimethylvinylsiloxy groups and having a viscosity of 1,000 Pa·s (vinyl group content=2.1 mass %) represented by the average formula $Me_2ViSiO(MePhSiO)_{17.5}SiMe_2Vi$ {in an amount such that the amount of silicon-bonded hydrogen atoms in the diphenylsiloxane is 1.0 mol relative to 1 mol of vinyl groups in the silicone fine particles (2) and the methylphenylpolysiloxane capped at both molecular terminals with dimethylvinylsiloxy groups} were additionally charged into the small pulverizer and stirred for 1 minute at room temperature (25° C.) to prepare a uniform white curable particulate silicone composition. Next, this composition was tableted by a tableting machine to prepare cylindrical pellets having a diameter of 14 mm and a height of 22 mm.

TABLE 1

|  | Example 1 | Example 2 | Example 3 | Example 4 | Example 5 |
|---|---|---|---|---|---|
| Properties of curable liquid silicone composition |  |  |  |  |  |
| Inorganic filler vol. % | 90.4 | 90.1 | 89.7 | 88.0 | 90.4 |
| Softening point (° C.) | 100 | 90 | 85 | 90 | 100 |
| Melt viscosity at 180° C. (Pa · s) | 70 | 60 | 50 | 60 | 85 |
| Moldability | Favorable | Favorable | Favorable | Favorable | Favorable |
| Properties of Cured Product |  |  |  |  |  |
| Average linear expansion coefficient (ppm/° C.) | 10 | 12 | 11 | 14 | 12 |
| Bending strength (MPa) | 48 | 34 | 21 | 52 | 51 |

|  | Example 6 | Example 7 | Example 8 | Example 9 | Example 10 | Example 11 |
|---|---|---|---|---|---|---|
| Properties of curable liquid silicone composition |  |  |  |  |  |  |
| Inorganic filler vol. % | 90.1 | 90.4 | 89.8 | 89.8 | 90.4 | 88.1 |
| Softening point (° C.) | 95 | 95 | 90 | 90 | 70 | 100 |
| Melt viscosity at 180° C. (Pa · s) | 65 | 70 | 80 | 85 | 150 | 90 |
| Moldability | Favorable | Favorable | Favorable | Favorable | Favorable | Favorable |
| Properties of Cured Product |  |  |  |  |  |  |
| Average linear expansion coefficient (ppm/° C.) | 11 | 10 | 10 | 10 | 12 | 14 |
| Bending strength (MPa) | 37 | 48 | 55 | 56 | 51 | 39 |

TABLE 2

|  | Comparative Example 1 | Comparative Example 2 | Comparative Example 3 | Comparative Example 4 | Comparative Example 5 |
|---|---|---|---|---|---|
| Properties of curable liquid silicone composition |  |  |  |  |  |
| Inorganic filler vol. % | 86.6 | 89.9 | 91.2 | 95.5 | 90.4 |
| Softening point (° C.) | 85 | N/A | 85 | N/A | 100 |

TABLE 2-continued

| | | | | | |
|---|---|---|---|---|---|
| Melt viscosity at 180° C. (Pa·s) | 70 | N/A | 321 | N/A | 130 |
| Moldability | Favorable | N/A | Unfilled | N/A | Cracks present |
| Properties of Cured Product | | | | | |
| Average linear expansion coefficient (ppm/° C.) | 16 | N/A | 13 | N/A | 10 |
| Bending strength (MPa) | 50 | N/A | 49 | N/A | 15 |

| | Comparative Example 6 | Comparative Example 7 | Comparative Example 8 |
|---|---|---|---|
| Properties of curable liquid silicone composition | | | |
| Inorganic filler vol. % | 89.7 | 89.1 | 89.7 |
| Softening point (° C.) | 95 | N/A | N/A |
| Melt viscosity at 180° C. (Pa·s) | 80 | N/A | N/A |
| Moldability | Cracks present | N/A | N/A |
| Properties of Cured Product | | | |
| Average linear expansion coefficient (ppm/° C.) | 11 | N/A | N/A |
| Bending strength (MPa) | 11 | N/A | N/A |

In Examples 1 to 11 of the present invention, a cured product having an average linear expansion coefficient of not greater than 15 ppm/° C. was obtained, and the moldability and mechanical strength were excellent. On the other hand, when the convent of the inorganic filler was increased in a known composition, the results indicated inferior moldability (including cracking), or a cured product having an average linear expansion coefficient of not greater than 15 ppm/° C. could not be realized. In addition, in some comparative examples, in particular, the melt viscosity was high even at a high temperature of 180° C., and sufficient handling workability was not achieved, while the bending strength and the like were also insufficient.

The invention claimed is:

1. A curable particulate silicone composition comprising:
   (A) hot-melt silicone fine particles having a softening point of 30° C. or higher and having a hydrosilylation reactive group and/or a radical reactive group;
   (B) an inorganic filler that is treated with a silicone-based surface treatment agent at 0.1 to 2.0 mass % relative to the mass of the inorganic filler, wherein the silicone-based surface treatment agent has at least one polysiloxane structure and a hydrolyzable silyl group in a molecule; and
   (C) a curing agent;
   wherein:
      a content of component (B) is in a range of from 87 to 95 vol. % of the total composition; and
      the curable particulate silicone composition provides a cured product having an average linear expansion coefficient of not greater than 15 ppm/° C. in a range of from 25° C. to 200° C.

2. The curable particulate silicone composition according to claim 1, wherein component (B) is a filler which does not have a softening point or which does not soften below the softening point of component (A) and is substantially an inorganic filler having an average particle diameter of 10.0 μm or more.

3. The curable particulate silicone composition according to claim 1, wherein component (B) is a spherical inorganic filler having an average particle diameter of 10.0 μm or more.

4. The curable particulate silicone composition according to claim 1, wherein a melt viscosity at 180° C. is not greater than 200 Pa·s.

5. The curable particulate silicone composition according to claim 1, wherein component (A) is silicone fine particles comprising ($A_1$) a resinous organopolysiloxane, ($A_2$) an organopolysiloxane crosslinked product obtained by partially crosslinking at least one type of organopolysiloxane, ($A_3$) a block copolymer composed of a resinous organosiloxane block and a chained organosiloxane block, or a mixture of at least two types thereof.

6. The curable particulate silicone composition according to claim 1, wherein component (A) is true-spherical silicone fine particles in which 10 mol % or more of silicon atom-bonded organic groups in component (A) are aryl groups, and an average primary particle diameter thereof is from 1 to 10 μm.

7. The curable particulate silicone composition according to claim 1, wherein the composition provides a cured product having a bending strength of 15 MPa or greater as measured by the method prescribed in JIS K 6911-1995 "General Testing Method for Thermosetting Plastics" when cured.

8. The curable particulate silicone composition according to claim 1, in a form of a pellet or a sheet.

9. A cured product obtained by curing the curable particulate silicone composition according to claim 1.

10. A semiconductor device comprising the cured product according to claim 9.

11. A power semiconductor having a structure in which a semiconductor element or a semiconductor circuit board is overmolded with the cured product according to claim 9.

12. A method of molding a cured product, said method comprising the steps of:
  (I) heating and melting the curable particulate silicone composition according to claim 1 to the softening point of component (A) or higher;
  (II) injecting the curable silicone composition obtained in step (I) into a mold and/or distributing the curable silicone composition obtained in step (I) to a mold by clamping; and
  (III) curing the curable silicone composition injected and/or distributed in step (II).

* * * * *